(12) United States Patent
Sano et al.

(10) Patent No.: US 8,237,295 B2
(45) Date of Patent: Aug. 7, 2012

(54) SEMICONDUCTOR DEVICE, METHOD FOR MANUFACTURING SEMICONDUCTOR DEVICE, AND MANUFACTURING APPARATUS FOR SEMICONDUCTOR DEVICE

(75) Inventors: Yuichi Sano, Mie-ken (JP); Takashi Imoto, Mie-ken (JP); Naoto Takebe, Mie-ken (JP); Katsuhiro Ishida, Mie-ken (JP); Tomomi Honda, Mie-ken (JP); Yasushi Kumagai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/052,368

(22) Filed: Mar. 21, 2011

(65) Prior Publication Data
US 2011/0309502 A1    Dec. 22, 2011

(30) Foreign Application Priority Data

Jun. 18, 2010    (JP) .................................. 2010-139998

(51) Int. Cl.
*H01L 23/48*    (2006.01)
*H01L 23/52*    (2006.01)
*H01L 23/40*    (2006.01)

(52) U.S. Cl. ....................... 257/784; 438/613

(58) Field of Classification Search .................. 257/784, 257/780, 781; 438/613, 617
See application file for complete search history.

(56) References Cited

U.S. PATENT DOCUMENTS

| 6,933,608 | B2 | 8/2005 | Fujisawa |
| 7,262,124 | B2 | 8/2007 | Fujisawa |
| 7,728,443 | B2 * | 6/2010 | Hembree ....................... 257/784 |
| 7,989,949 | B2 * | 8/2011 | Gupta et al. ................... 257/720 |
| 2007/0176619 | A1 * | 8/2007 | Khandros et al. ............. 324/762 |
| 2008/0099895 | A1 * | 5/2008 | Kwak ............................ 257/676 |
| 2008/0111252 | A1 * | 5/2008 | Qin et al. ...................... 257/784 |
| 2009/0001608 | A1 * | 1/2009 | Mii et al. ...................... 257/780 |
| 2009/0267218 | A1 * | 10/2009 | Gupta et al. .................. 257/692 |

FOREIGN PATENT DOCUMENTS

| JP | 2004-172477 | 6/2004 |
| JP | 2010-103403 | 5/2010 |

* cited by examiner

*Primary Examiner* — S. V Clark
(74) *Attorney, Agent, or Firm* — Oblon, Spivak, McClelland, Maier & Neustadt, L.L.P.

(57) ABSTRACT

According to one embodiment, a semiconductor device includes a first semiconductor element, a first electrode, a ball part, a second electrode, and a wire. The first electrode is electrically connected to the first semiconductor element. The ball part is provided on the first electrode. The wire connects the ball part and the second electrode. A thickness of a turned-back portion at an end of the wire on a side opposite to the second electrode is smaller than a diameter of the wire.

20 Claims, 15 Drawing Sheets

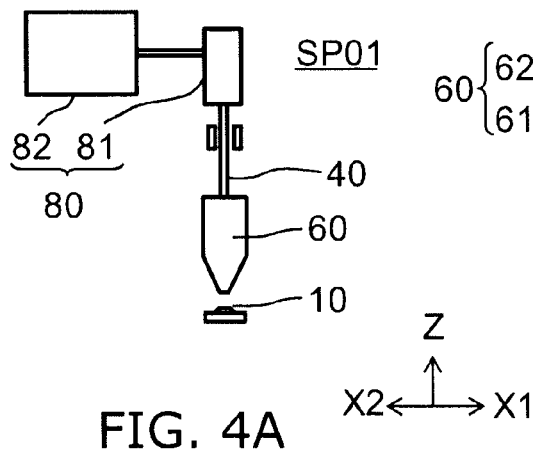
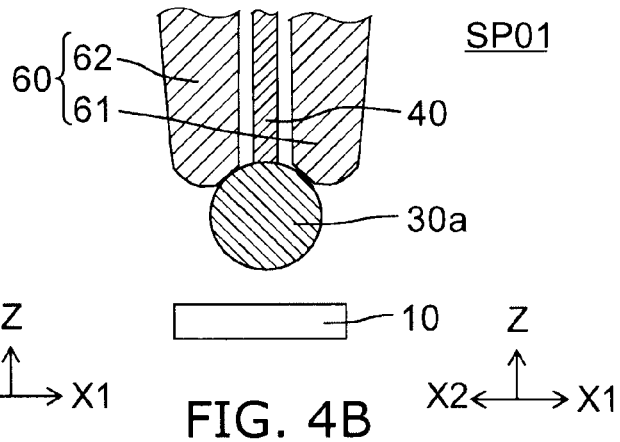
FIG. 4A  FIG. 4B
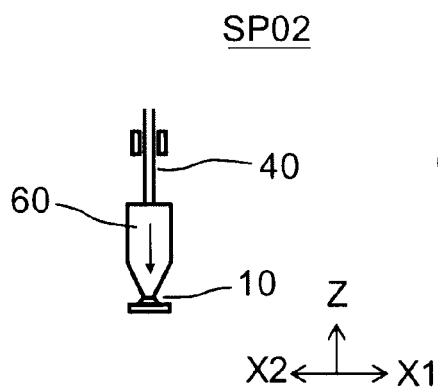
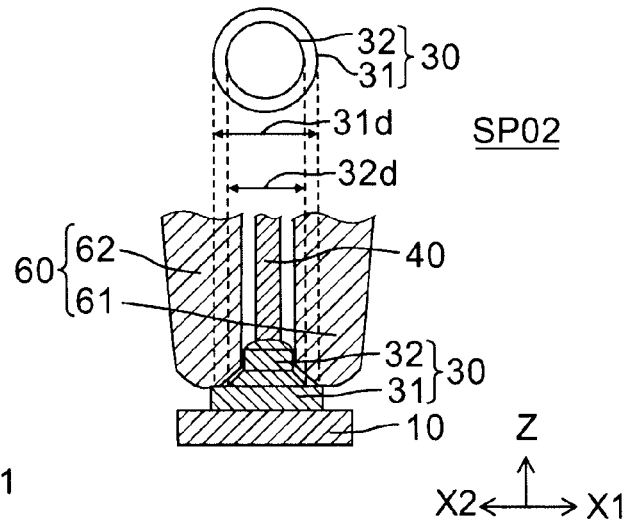
FIG. 4C  FIG. 4D
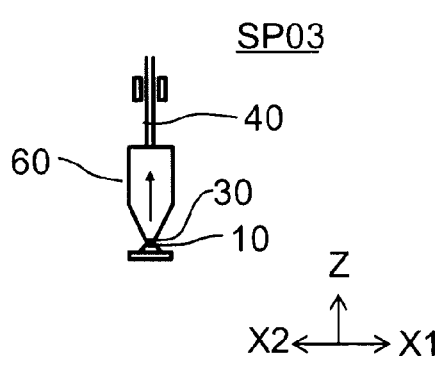
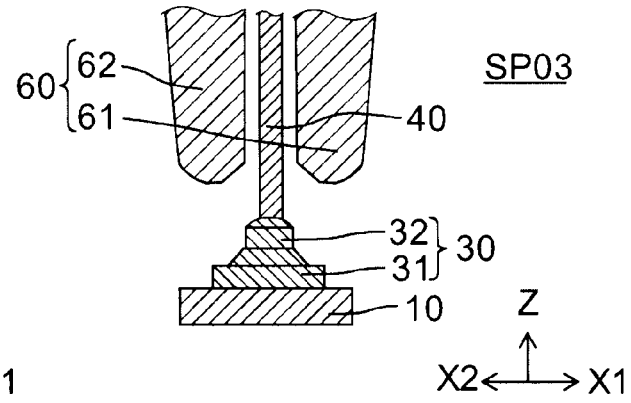
FIG. 4E  FIG. 4F

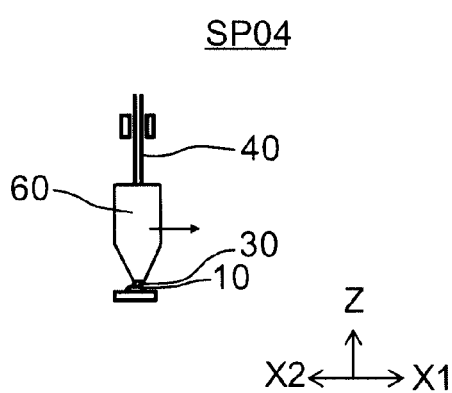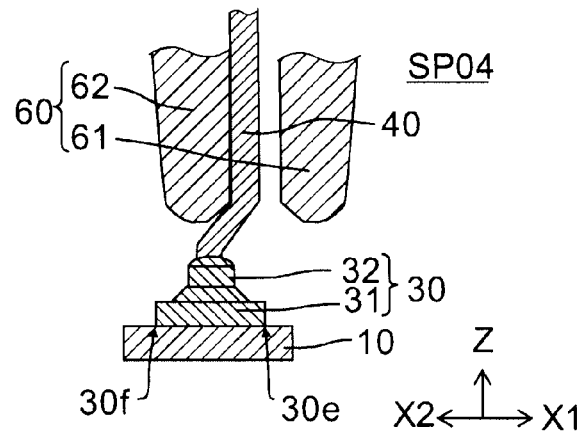
FIG. 5A  FIG. 5B
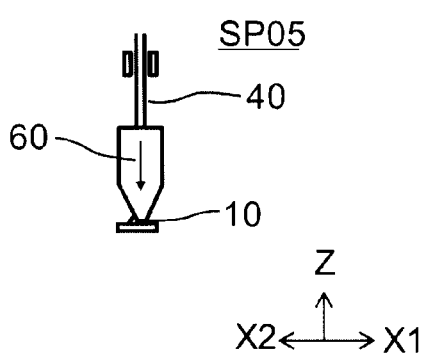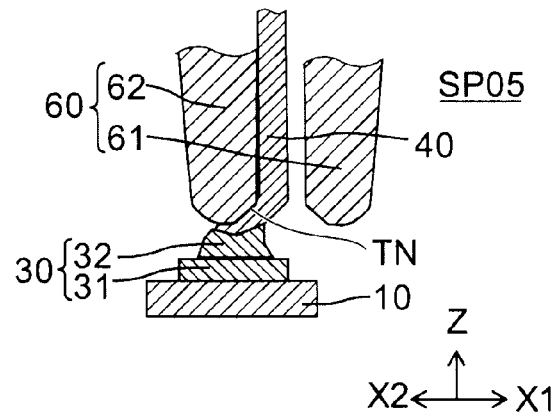
FIG. 5C  FIG. 5D
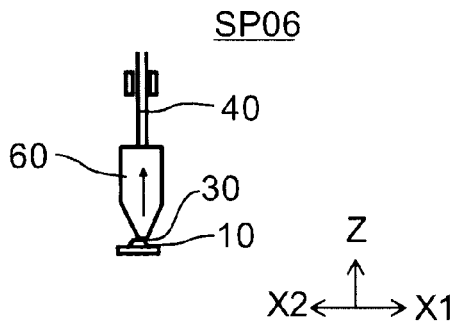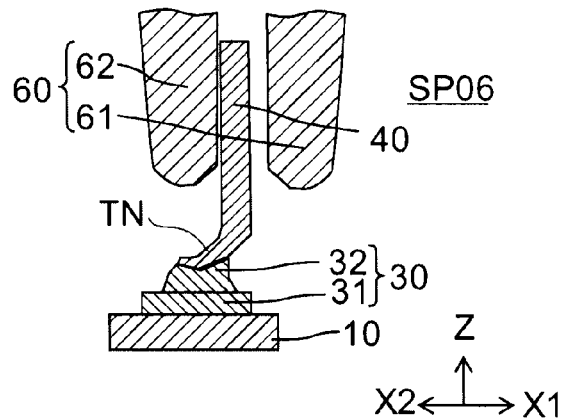
FIG. 5E  FIG. 5F

SEMICONDUCTOR DEVICE, METHOD FOR MANUFACTURING SEMICONDUCTOR DEVICE, AND MANUFACTURING APPARATUS FOR SEMICONDUCTOR DEVICE

CROSS-REFERENCE TO RELATED APPLICATIONS

This application is based upon and claims the benefit of priority from the prior Japanese Patent Application No. 2010-139998, filed on Jun. 18, 2010; the entire contents of which are incorporated herein by reference.

FIELD

Embodiments described herein relate generally to a semiconductor device, a method for manufacturing a semiconductor device, and a manufacturing apparatus for a semiconductor device.

BACKGROUND

Semiconductor chips are connected by bonding wire to, for example, mounted components or other semiconductor chips. With the progress in large scale integration of semiconductor chips, the number of bonding wires increases. In order to reduce the resources for semiconductor devices, it is desirable that the bonding wire material per connection is reduced.

BRIEF DESCRIPTION OF THE DRAWINGS

FIGS. 4A to 4F are schematic views illustrating a method for manufacturing the semiconductor device according to the first embodiment;

FIGS. 5A to 5F are schematic views illustrating the method for manufacturing the semiconductor device according to the first embodiment;

DETAILED DESCRIPTION

Figure 1A:
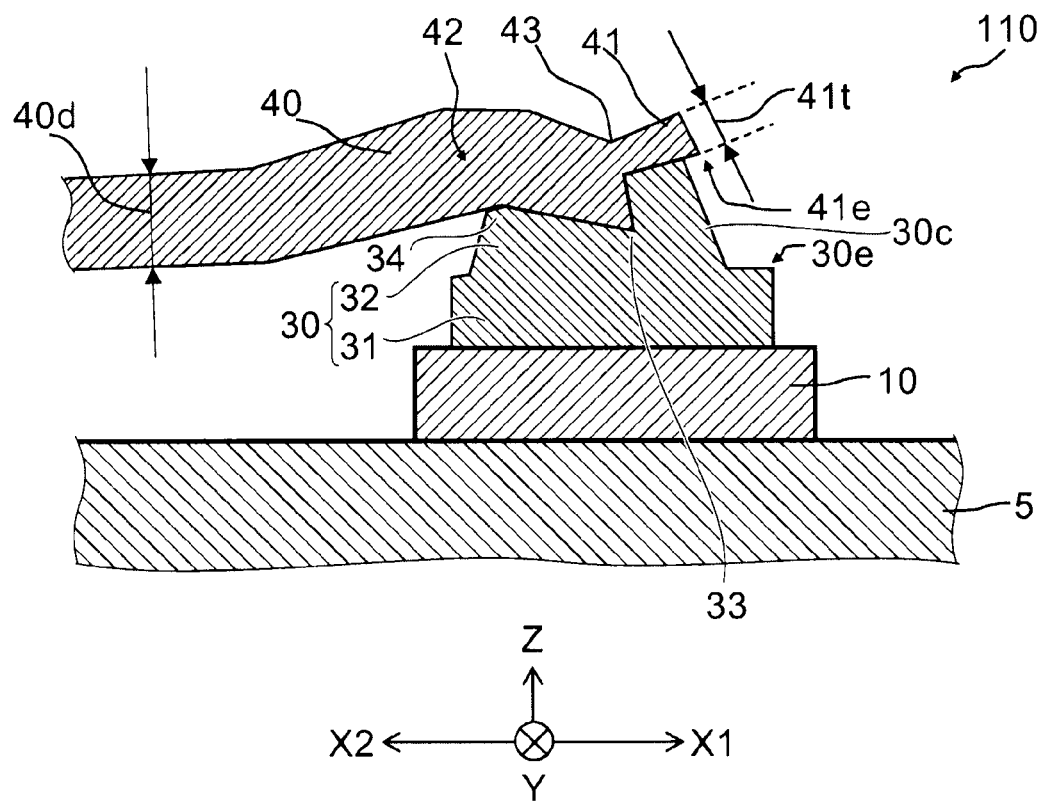
FIGS. 1A and 1B are schematic cross-sectional views illustrating the configuration of a semiconductor device according to a first embodiment.

In general, according to one embodiment, a semiconductor device includes a first semiconductor element, a first electrode, a ball part, a second electrode, and a wire. The first electrode is electrically connected to the first semiconductor element. The ball part is provided on the first electrode. The wire connects the ball part and the second electrode. The wire includes a turned-back portion at an end of the wire on a side opposite to the second electrode. A thickness of the turned-back portion is smaller than a diameter of the wire.

Embodiments will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

Figure 1B:
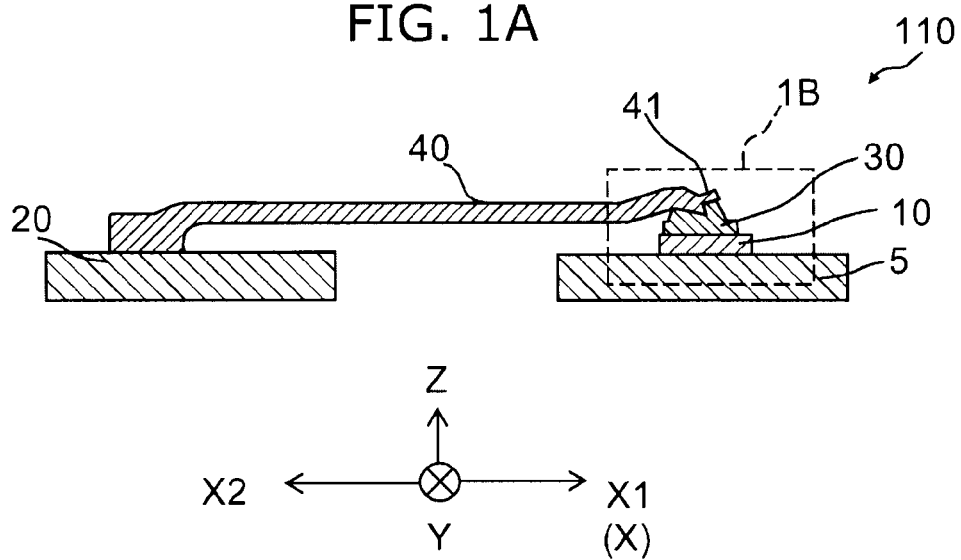

FIGS. 1A and 1B are schematic cross-sectional views illustrating the configuration of a semiconductor device according to a first embodiment.

Specifically, FIG. 1B illustrates an overview of the semiconductor device, and FIG. 1A illustrates an enlargement of a portion 1B in FIG. 1B.

Figure 2:
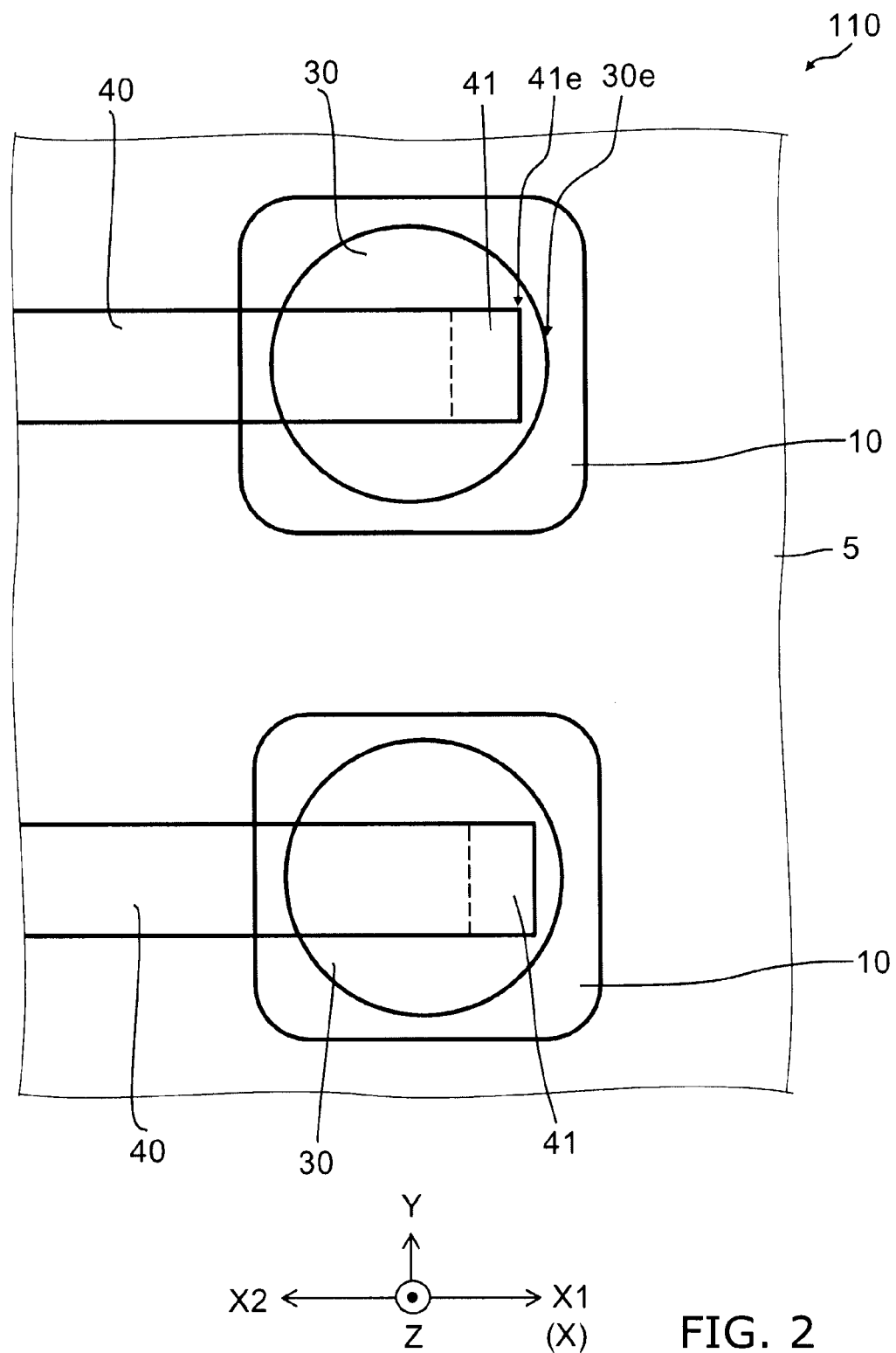
FIG. 2 is a schematic plan view illustrating the configuration of the semiconductor device according to the first embodiment.

FIG. 2 is a schematic plan view illustrating the configuration of the semiconductor device according to the first embodiment.

FIG. 2 illustrates an enlargement of the portion 1B in FIG. 1B.

As illustrated in FIG. 1B, the semiconductor device 110 according to this embodiment includes a first semiconductor element (semiconductor element 5), a first electrode 10, a second electrode 20, a ball part 30, and a wire 40.

The first electrode 10 is electrically connected to the semiconductor element 5. A semiconductor chip such as memory, for example, is used for the semiconductor element 5. However, the embodiment is not limited thereto, and any semiconductor chip may be used for the semiconductor element 5.

The second electrode 20 is an electrode of a semiconductor element (semiconductor chip) different from the semiconductor element 5. Also, the second electrode 20 may be an electrode of a mounted component or the like, such as a lead, a printed-circuit board or the like, for example.

The ball part 30 is provided on the first electrode 10.

The wire 40 connects the ball part 30 and the second electrode 20. In other words, one end of the wire 40 contacts the ball part 30, and the other end of the wire 40 contacts the second electrode 20.

A material such as gold, for example, is used for the ball part 30 and the wire 40.

Here, for convenience of explanation, the direction perpendicular to a major surface of the first electrode 10 (the surface to which the ball part 30 is connected) is taken to be a Z-axis direction. One direction parallel to the major surface of the first electrode 10 is taken to be an X-axis direction, and a direction perpendicular to the Z-axis direction and the X-axis direction is taken to be a Y-axis direction.

In an X-Y plane, the direction from the second electrode 20 toward the first electrode 10 is defined as an X1 direction (first direction). In the X-Y plane, the direction from the first electrode 10 to the second electrode 20 is defined as an X2 direction (second direction). The X2 direction is an opposite direction to the X1 direction.

The wire 40 extends between the first electrode 10 and the second electrode 20 along the X-axis direction. In this specific example, the position of the major surface (the surface to which the ball part 30 is connected) of the first electrode 10 along the Z-axis direction is substantially the same as the position of a connection surface (a surface to which the wire 40 is connected) of the second electrode 20 along the Z-axis direction, but as described below, the position of the major surface of the first electrode 10 along the Z-axis direction may be different from the position of the connection surface of the second electrode 20 along the Z-axis direction. In other words, the height of the major surface of the first electrode 10 may be the same as the height of the connection surface of the second electrode 20, or it may be different.

When the height of the major surface of the first electrode 10 is the same as the height of the connection surface of the second electrode 20, and also when it is different, the X1 direction and the X2 direction are the direction from the second electrode 20 toward the first electrode 10 and the direction from the first electrode 10 toward the second electrode 20 in the X-Y plane, respectively.

As illustrated in FIG. 1A, the ball part 30 is formed on the first electrode 10. The ball part 30 has a seating part 31 and an upper part 32. The length of the seating part 31 of the ball part 30 along the X1 direction (or the X2 direction) is longer than the length of the upper part 32 along the X1 direction (or the X2 direction). A protrusion 30c is formed on the upper part 32 of the ball part 30 on the side opposite to the first electrode 10. The protrusion 30c is formed by crushing the upper part 32 of the ball part 30 with a capillary. Also, a recess 33 is formed on the upper part 32 by crushing the upper part 32. The protrusion 30c is, for example, included in the upper part 32.

A turned-back portion 41 is formed in the end of the wire 40 on the side opposite to the second electrode 20. The turned-back portion 41 is a portion of the wire 40 located above the protrusion 30c. The thickness 41t of the turned-back portion 41 is smaller than the diameter 40d of the wire 40. Here, the diameter 40d of the wire 40 is the average diameter of the wire.

The turned-back portion 41 is the portion farther to the X1 direction than a neck part 42 of the wire 40. Here, the neck part 42 of the wire 40 is the boundary portion between the portion of the wire 40 in contact with the ball part 30 and the portion of the wire 40 that extends toward the second electrode 20.

As described above, the recess 33 is formed near the center of the upper part 32 of the ball part 30 in the X-axis direction. A peak 34 of the upper part 32 is formed by the recess 33 above the end of the ball part 30 on the second electrode 20 side. With this peak 34, the neck part 42 extends upward in the Z-axis direction. As a result, it is possible to extend the wire 40 generally parallel to the main plane of the semiconductor element 5.

The turned-back portion 41 is located, for example, farther to the side opposite to the second electrode 20 than the center along the X1 direction (or the X2 direction) of the ball part 30. In other words, the turned-back portion 41 has a portion located farther to the X1 direction than the center in the X-axis direction of the connection portion between the wire 40 and the ball part 30. As discussed below, the turned-back portion 41 is a portion where the wire 40 is crushed by a capillary.

As illustrated in FIG. 1A, an end 41e of the turned-back portion 41 on the side opposite to the second electrode 20 is located farther to the X2 direction than the end 30e of the ball part 30 on the side opposite to the second electrode 20. In other words, the end 41e of the turned-back portion 41 on the side opposite to the second electrode 20 is located closer to the second electrode 20 than the end 30e of the ball part 30 on the side opposite to the second electrode 20.

As illustrated in FIG. 2, a plurality of first electrodes 10 may be provided in the semiconductor device 110. The plurality of first electrodes 10 may be arranged along the Y-axis direction, for example. Also, each of a plurality of ball parts 30 is provided for each of the plurality of first electrodes 10, and each of a plurality of wires 40 is connected to each of the plurality of ball parts 30.

As viewed from the direction perpendicular to the major surface of the first electrode 10 (the Z-axis direction), the turned-back portion 41 of the wire 40 is located within the range of the profile (outer edge) of the ball part 30 (for example, the seating part 31). In other words, the turned-back portion 41 is located inside the profile (outer edge) of the ball part 30, and does not protrude from the ball part 30.

As illustrated in FIG. 1A, in this specific example, the wire 40 has a recess 43 above the ball part 30. A neck part 42 of the wire 40 extends in the X2 direction while slanting downward in the Z-axis direction. However, the embodiment is not limited thereto, and the wire 40 may not have the recess 43. For example, as described below, the shape of the wire 40 above the ball part 30 may be nearly flat.

Figure 3A:
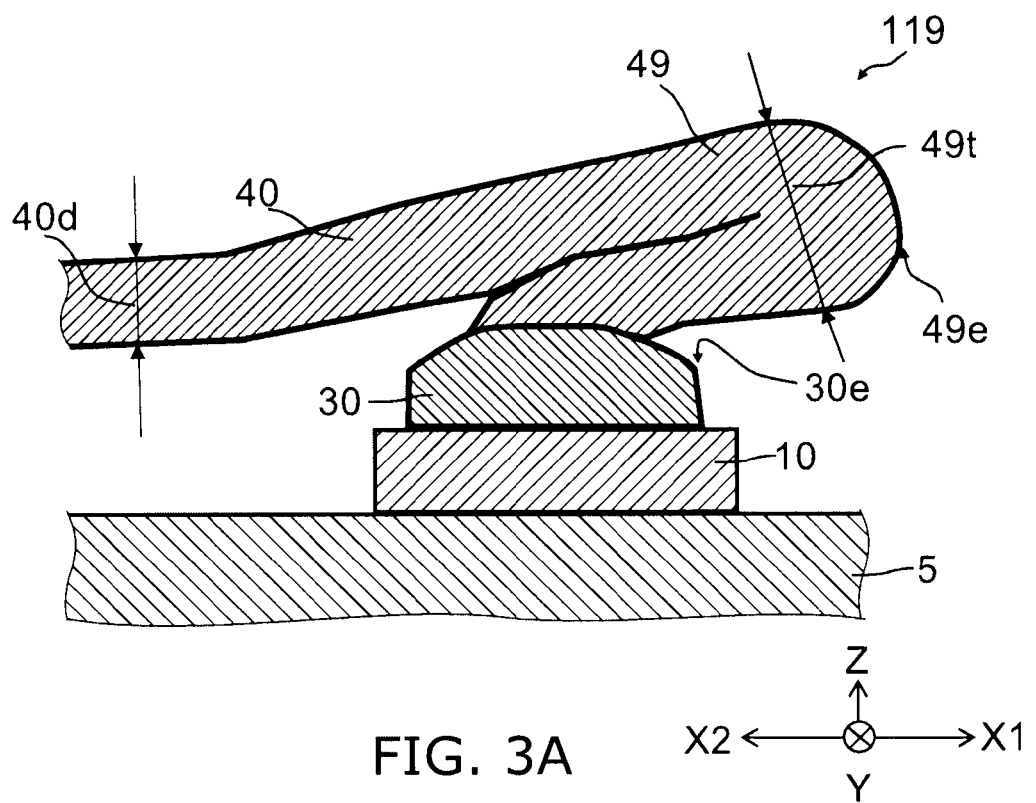
FIGS. 3A and 3B are schematic views illustrating the configuration of a semiconductor device of a reference example.
Figure 3B:
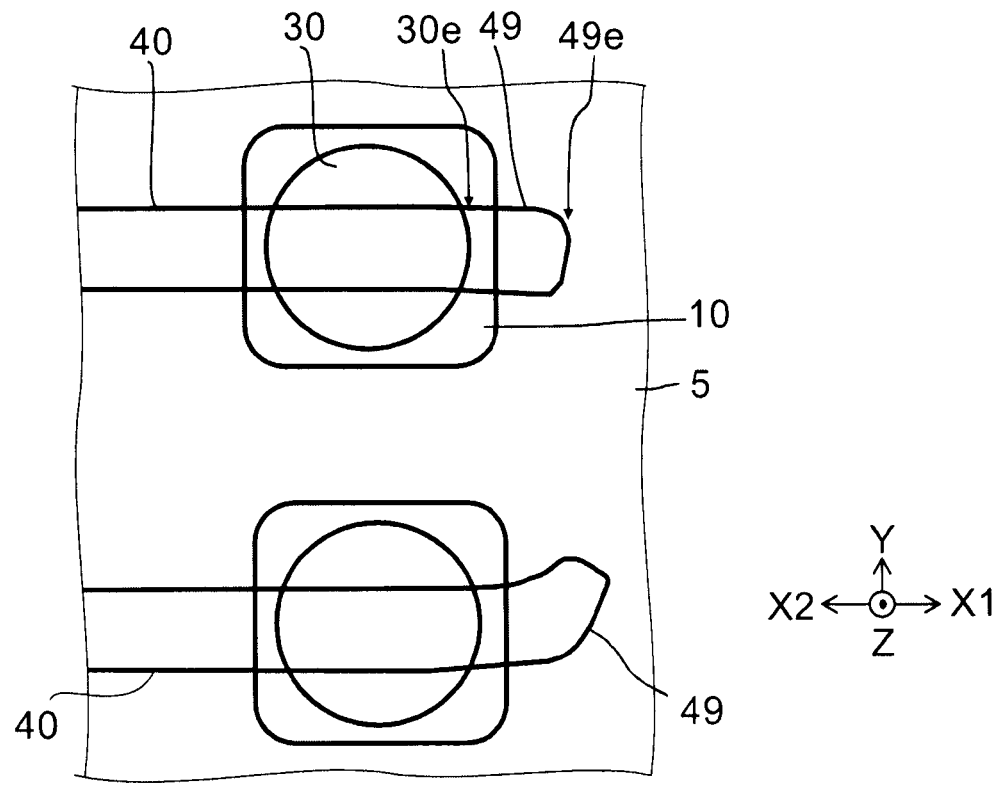

FIGS. 3A and 3B are schematic views illustrating the configuration of a semiconductor device of a reference example.

Specifically, FIG. 3A is a schematic cross-sectional view, and FIG. 3B is a schematic plan view.

As illustrated in FIGS. 3A and 3B, in the semiconductor device 119 of the reference example, the thickness 49t of a double turned-back portion 49 at the end of the wire 40 on the side opposite to the second electrode 20 is larger than the diameter 40d of the wire 40. The double turned-back portion 49 in the semiconductor device 119 is an overlapping portion of the portion of the wire 40 that extends from the ball part 30 toward the X1 direction and the portion of the wire 40 that is turned back from end in the X1 direction and extends toward the X2 direction. Therefore, the thickness 49t of the double turned-back portion 49 in the semiconductor device 119 is about double the diameter 40d of the wire 40.

Here, as illustrated in FIG. 3B, of the two wires 40 illustrated, the double turned-back portion 49 of the wire 40 on the lower side of the drawing is inclined toward the wire 40 on the upper side of the drawing. In recent years, the gaps between wires 40 have become narrower due to miniaturization. Here, there is a possibility that double turned-back portions 49 undesirably contacts an adjacent wire 40. Therefore, as in this embodiment, it is desirable that the turned-back portion 41 does not protrude from the ball part 30 as viewed from the Z-axis direction.

In the semiconductor device 119, the end 49e of the double turned-back portion 49 on the side opposite to the second electrode 20 is located farther in the X1 direction than the end 30e of the ball part 30 on the side opposite to the second electrode 20. In other words, the end 49e of the double turned-back portion 49 on the side opposite to the second electrode 20 is located farther from the second electrode 20 than the end 30e of the ball part 30 on the side opposite to the second electrode 20.

In the semiconductor device 119, as viewed along the Z-axis direction, the double turned-back portion 49 of the wire 40 has a portion outside the range of the profile of the ball part 30. In other words, the double turned-back portion 49 protrudes from the ball part 30.

The double turned-back portion 49 in the semiconductor device 119 of this type of reference example is formed to form a low loop shape, for example. The double turned-back portion 49 in the semiconductor device 119 of the reference example has, for example, a thickness of two wires 40, and has a portion protruding from the ball part 30, so the double turned-back portion 49 is large. Therefore, much wire 40 material is used to form the double turned-back portion 49.

In contrast, in the semiconductor device 110 according to this embodiment, the turned-back portion 41 (a tail portion of the wire 40) is small, and the thickness 41t of the turned-back portion 41 is smaller than the diameter 40d of the wire 40. In the semiconductor device 110, the length of the turned-back portion 41 is short, and the end 41e of the turned-back portion 41 is closer to the second electrode 20 than the end 30e of the ball part 30. In the semiconductor device 110, the turned-back portion 41 does not protrude from the ball part 30. In the semiconductor device 110, the turned-back portion 41 is small, so the amount of material of the wire 40 used to form the turned-back portion 41 is small. In this way, it is possible to provide a semiconductor device with a reduced quantity of wire.

In the case where no turned-back portion is provided in order to reduce the quantity of wire 40 used, the height of the wire 40 increases, which obstructs making a semiconductor device thinner. Here, the height of the wire 40 is the height from the surface of the semiconductor element 5 to the highest top surface of the wire 40 on the semiconductor element 5. In the case where a turned-back portion is provided, the height of the wire 40 can be reduced, as described below. Also, the wire 40 can be deformed and defects can occur due to mold resin or the like which would reduce the mechanical strength of the wire 40.

In contrast, in the semiconductor device 110 according to this embodiment, the height of the wire 40 can be reduced by providing the turned-back portion 41 located farther to the X1 direction than the center in the X-axis direction of the connection portion between the wire 40 and the ball part 30. In other words, in the semiconductor device 110, the quantity of wire can be reduced while keeping the height of the wire 40 low.

An example of a method for manufacturing the semiconductor device 110 according to this embodiment will be described.

FIGS. 4A to 4F, FIGS. 5A to 5F, FIGS. 6A to 6F, and FIGS. 7A to 7E are schematic views illustrating a method for manufacturing the semiconductor device according to the first embodiment.

FIGS. 4A, 4C, 4E, 5A, 5C, 5E, 6A, 6C, and 6E illustrate the state and operation of a capillary 60 in each of the processes of steps SP01 to SP09. FIG. 4B, 4D, 4F, 5B, 5D, 5F, 6B, 6D, and 6F illustrate the states of the capillary 60, the first electrode 10, the ball part 30, and the wire 40 in each of the processes of steps SP01 through SP09.

FIGS. 7A to 7E illustrate the state and operation of the capillary 60 in steps SP10 to SP14. In FIG. 4D, a plan view of the ball part 30 is also drawn in addition to the cross-sectional view.

As illustrated in FIG. 4A, in this manufacturing method, a manufacturing apparatus (bonding apparatus) that includes the capillary 60 and a control unit 80 is used. The control unit 80 includes an arm 81 and a drive unit 82. The capillary 60 is installed on the tip of the arm 81. The arm 81 is driven by the drive unit 82, and in this way the position of the capillary 60 relative to the first electrode 10 is displaced (moved). In each of the other drawings, the control unit 80 is omitted.

The capillary 60 has a first electrode side tip 61 on the X1 direction side (first electrode 10 side), and a second electrode side tip 62 on the second direction (second electrode 20 side). The first electrode side tip 61 is in opposition to the second electrode side tip 62.

As illustrated in FIGS. 4A and 4B, the capillary 60 is disposed above the first electrode 10, and the capillary 60 tip forms a ball 30a that will become the ball part 30 (step SP01). The diameter of the capillary 60 is about, for example, not less than 60 micrometers ($\mu$m) and not more than 80 $\mu$m. However, this embodiment is not limited thereto, and the diameter of the capillary 60 is arbitrary.

As illustrated in FIGS. 4C and 4D, the capillary 60 is lowered, and the ball 30a is pressed into the first electrode 10 (step SP02). The ball 30a is deformed to reflect a shape of the tip portion of the capillary 60, to form the seating part 31 and the upper part 32 above the seating part 31. The ball part 30 includes the seating part 31 and the upper part 32.

The diameter 31d of the seating part 31 is, for example, 50 $\mu$m to 60 $\mu$m, and the diameter 32d of the upper part 32 is, for example, about 5 $\mu$m to 10 $\mu$m smaller than the diameter 31d of the seating part 31. However, the embodiment is not limited thereto, and the diameter 31d of the seating part 31 and the diameter 32d of the upper part 32 is arbitrary.

As illustrated in FIGS. 4E and 4F, the capillary 60 is raised with the wire 60 released (step SP03).

As illustrated in FIGS. 5A and 5B, the capillary 60 is moved relative to the first electrode 10 in the X1 direction (step SP04). In this way, the wire 40 contacts the second electrode side tip 62. The movement distance of the capillary 60 toward the X1 direction at this time is a distance such that a contact portion between the second electrode side tip 62 and the wire 40 is in the range of the ball part 30.

In other words, the contact portion between the second electrode side tip 62 and the wire 40 farther to the second electrode 20 side (the X2 direction side) than the end 30e of the ball part 30 on the opposite side of the second electrode 20, and farther to the X1 direction side than the end 30f on the second electrode 20 side of the ball part 30. For example, the end of the wire 40 on the X1 direction side is farther to the second electrode 20 side (the X2 direction side) than the end 30e of the ball part 30 on the opposite side of the second electrode 20, and is farther to the X1 direction side than the end 30f on the second electrode 20 side of the ball part 30.

As illustrated in FIGS. 5C and 5D, the capillary 60 is lowered, and the wire 40 is deformed by the capillary 60 (step SP05). Specifically, the wire 40 (and the ball part 30) is pressed to the first electrode 10 by the second electrode side tip 62, and the wire 40 (and the ball part 30) is deformed. In other words, the wire 40 is pressed toward the first electrode 10 by the second electrode side tip 62, and is deformed.

As illustrated in FIGS. 5E and 5F, the capillary 60 is raised with the wire 40 released (step SP06). As a result of this step SP05, a portion TN is formed where the diameter of the wire 40 is narrowed. This portion TN where the diameter of the wire 40 is narrowed will ultimately become the turned-back portion 41.

Figure 6A:
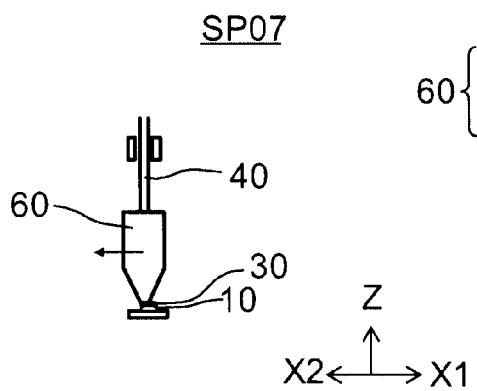
FIGS. 6A to 6F are schematic views illustrating the method for manufacturing the semiconductor device according to the first embodiment.
Figure 6B:
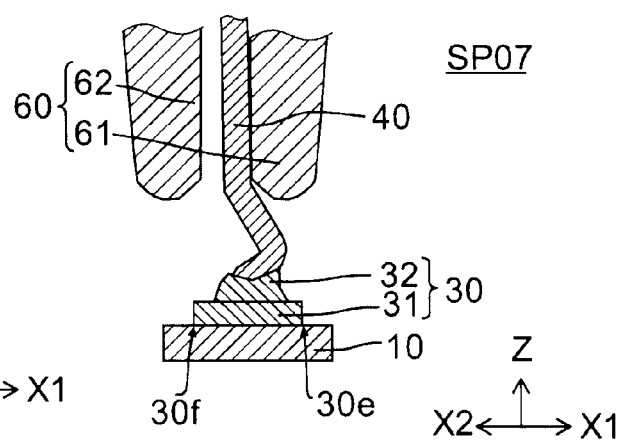

As illustrated in FIGS. 6A and 6B, the capillary 60 is moved relative to the first electrode 10 in the X2 direction (step SP07). In this way, the axis of the wire 40 is bent in the X2 direction. For example, the side face on the X1 direction side of the wire 40 contacts the inner sidewall of the capillary 60.

By moving the capillary 60 in the X2 direction relative to the first electrode 10, the wire 40 contacts the first electrode side tip 61.

The movement distance of the capillary 60 toward the X2 direction at this time is a distance such that a contact portion between the first electrode side tip 61 and the wire 40 is within the range of the ball part 30.

In other words, the contact portion between the first electrode side tip 61 and the wire 40 is farther to the second electrode 20 side (the X2 direction side) than the end 30e of the ball part 30 on the opposite side of the second electrode 20, and is farther to the X1 direction side than the end 30f of the second electrode 20 side of the ball part 30. For example, the end of the wire 40 on the X1 direction side is farther to the second electrode 20 side (the X2 direction side) than the end 30e of the ball part 30 on the opposite side of the second electrode 20, and is farther to the X1 direction side than the end 30f on the second electrode 20 side of the ball part 30.

If the amount of movement in this step SP07 is small, the turned-back portion 41 of the wire 40 will not be formed. The appropriate amount of movement in step SP07 varies depending on the diameter 40d of the wire 40, the amount of movement of the capillary 60 in step SP04, and the like. The appropriate amount of movement in step SP07 can be obtained by, for example, tests in which the movement distance of the capillary 60 is varied.

As a result of carrying out step SP04 and step SP05, and subsequently carrying out step SP07, the wire 40 is bent a first time in the X1 direction and a second time in the X2 direction.

Figure 6C:
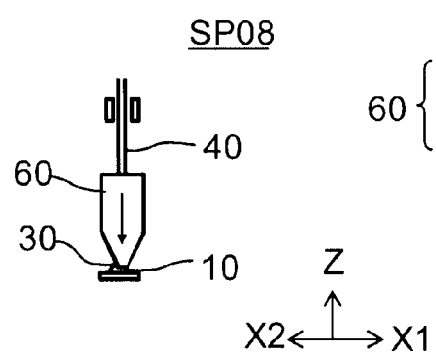
Figure 6D:
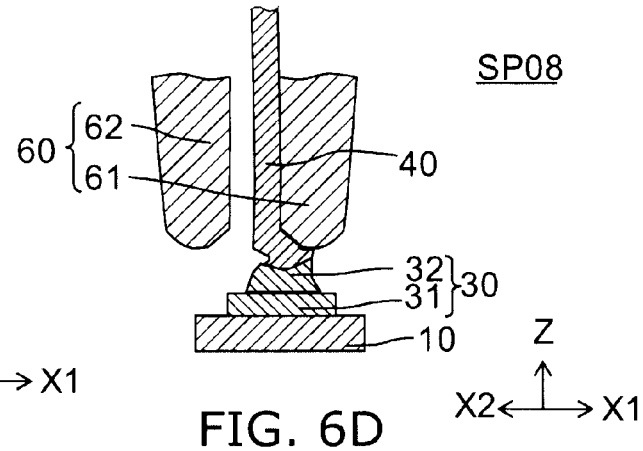

As illustrated in FIGS. 6C and 6D, the capillary 60 is lowered, and the wire 40 is deformed by the capillary 60 (step SP08). Specifically, the wire 40 (and the ball part 30) is pressed to the first electrode 10 by the first electrode side tip 61, and the wire 40 (and the ball part 30) is deformed. In other words, the wire 40 is pressed toward the first electrode 10 by the first electrode side tip 61, and is deformed.

In the example illustrated in FIG. 6D, the state wherein a recess is not formed in the wire 40 on the top of the ball part 30 is illustrated, but as described below, in step SP08, a recess may be formed in the wire 40 on the top of the ball part 30. Whether or not there is a recess 43 in the wire 40 on top of the ball part 30 can be controlled by various conditions such as, for example, the shape of the tip of the capillary 60, the movement distance of the capillary 60 in steps SP05 to SP08, and the like.

Figure 6E:
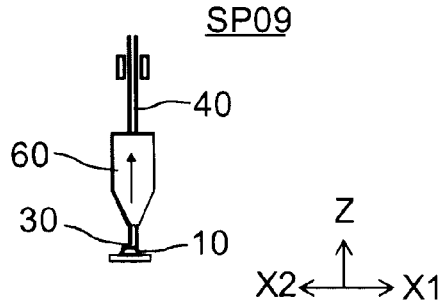
Figure 6F:
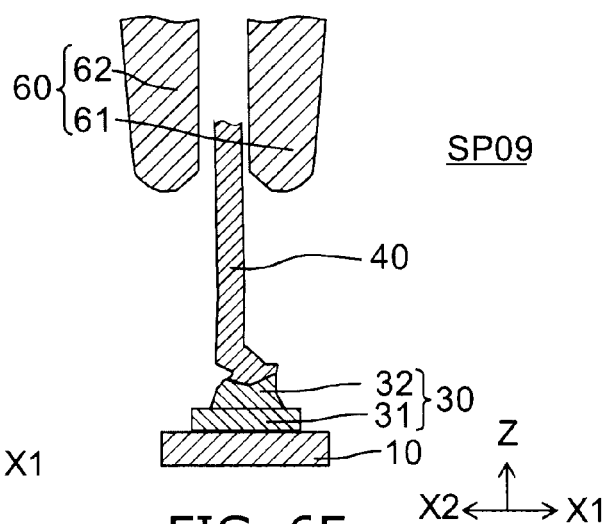

As illustrated in FIGS. 6E and 6F, the capillary 60 is raised with the wire 40 released (step SP09).

Figure 7A:
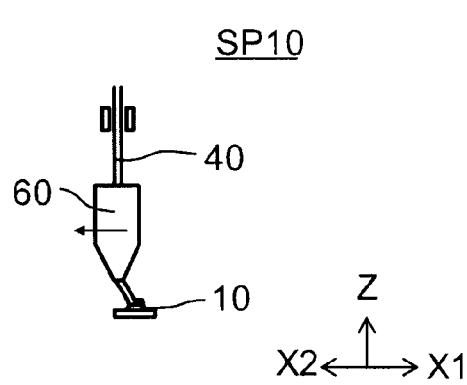
FIGS. 7A to 7E are schematic views illustrating the method for manufacturing the semiconductor device according to the first embodiment.

Then, as illustrated in FIG. 7A, the capillary 60 is moved relative to the first electrode 10 in the X2 direction (step SP10).

Figure 7B:
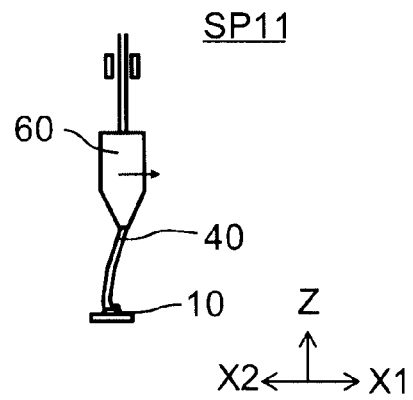

Then, as illustrated in FIG. 7B, the capillary 60 is moved relative to the first electrode 10 in the X1 direction (step SP11).

Figure 7C:
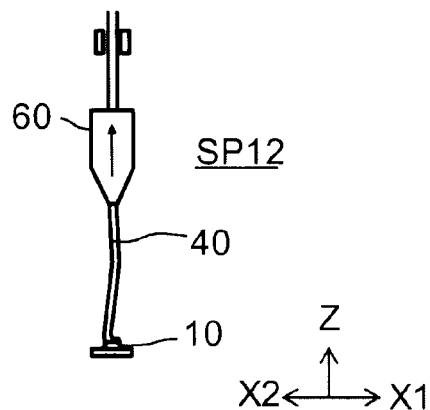

Then, as illustrated in FIG. 7C, the capillary 60 is raised further (step SP12).

Figure 7D:
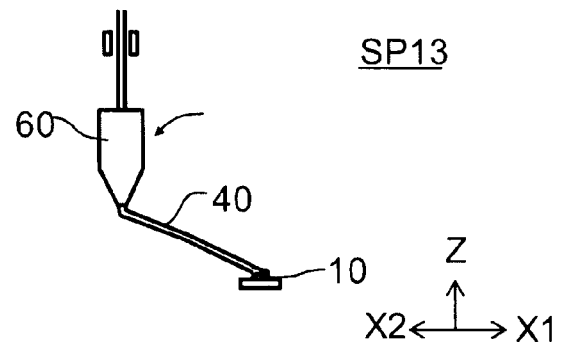

Then, as illustrated in FIG. 7D, the capillary 60 is moved toward the second electrode 20 (not illustrated) along the X2 direction (step SP13).

Figure 7E:
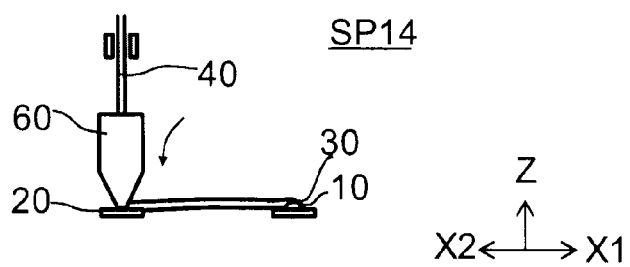

Then, as illustrated in FIG. 7E, the capillary 60 is brought into close contact with the second electrode 20, and the end of the wire 40 on the side opposite to the ball part 30 is connected to the second electrode (step SP14).

In this way, the semiconductor device 110 illustrated in FIGS. 1A and 1B and FIG. 2 is manufactured.

As a result of carrying out the above steps SP10 and SP11, the wire 40 is given a tendency to bend, for example, so the height of the wire 40 in the extended portion between the first electrode 10 and the second electrode 20 is reduced.

In the manufacture of the semiconductor device 110 as described above, the wire 40 is crushed twice. In other words, crushing of the wire 40 (and the ball part 30) by the second electrode side tip 62 after moving the capillary 60 toward the X1 direction (step SP05), and crushing of the wire 40 (and the ball part 30) by the first electrode side tip 61 after moving the capillary 60 toward the X2 direction (step SP08), are carried out. The turned-back portion 41 is formed as a result of these two crushings of the wire 40. The turned-back portion 41 is the portion of the wire 40 that is crushed by the capillary 60 and the diameter of the wire 40 is reduced, so the thickness 41t of the turned-back portion 41 is smaller than the diameter 40d of the wire 40.

For example, the diameter 40d of the wire 40 is 20 µm, and the thickness 41t of the turned-back portion 41 is about 10 µm. However, as described below, the shape of the turned-back portion 41 may have various deformations, and the thickness 41t of the turned-back portion 41 with respect to the diameter 40d of the wire 40 is not limited to the value above. The thickness 41t is arbitrary in the condition where the thickness 41t is smaller than the diameter 40d.

In the embodiment, the diameter 40d of the wire 40 is, for example, not less than 5 µm and not more than 40 µm. When the diameter 40d of the wire 40 is less than 5 µm, for example the resistance of the connection increases. When the diameter 40d of the wire 40 exceeds 40 µm, for example the density of the connection increases.

Figure 8A:
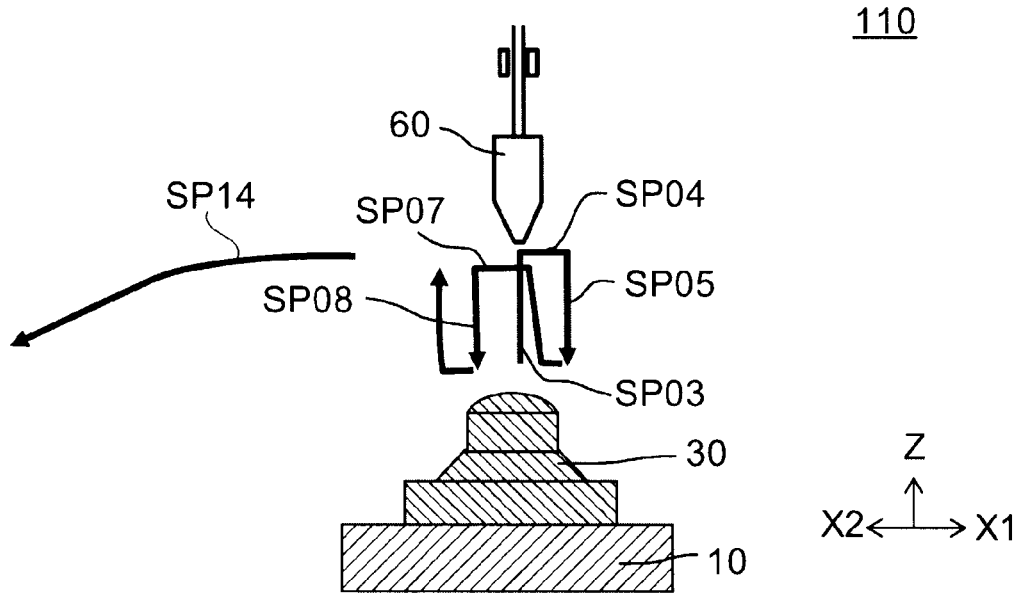
FIGS. 8A and 8B are schematic views illustrating semiconductor device manufacturing processes.
Figure 8B:
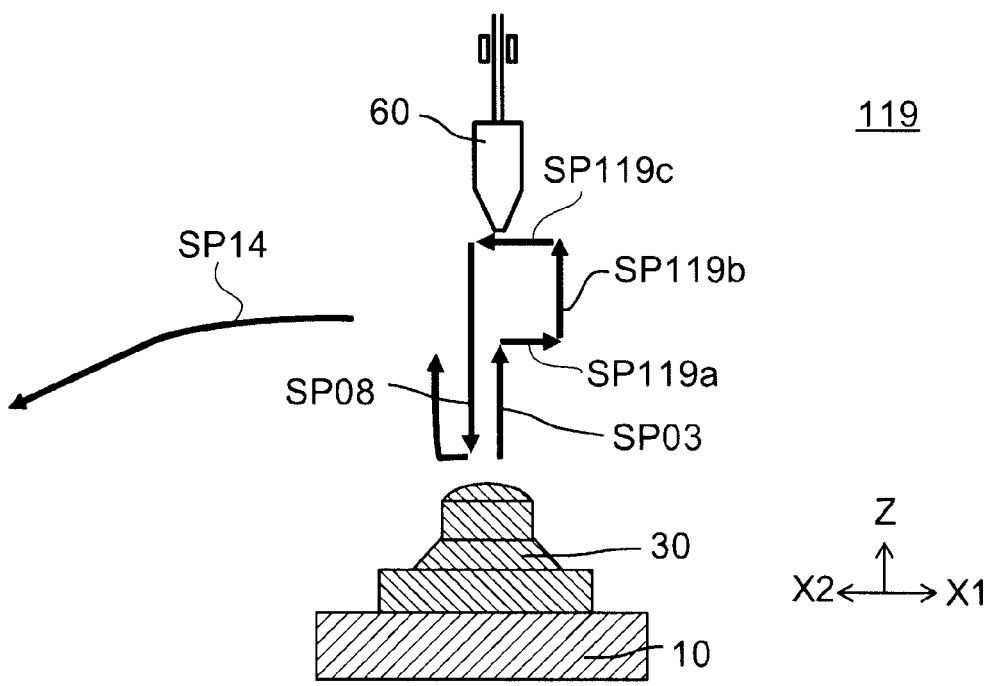

FIGS. 8A and 8B are schematic views illustrating semiconductor device manufacturing processes.

Specifically, FIG. 8A schematically illustrates the movement of the capillary 60 for the semiconductor device 110 according to the embodiment, and FIG. 8B schematically the movement of the capillary 60 for the semiconductor device 119 of the reference example.

As illustrated in FIG. 8A, in the manufacture of the semiconductor device 110, after moving the capillary 60 in the X1 direction relative to the first electrode 10 (step SP04), the capillary 60 is lowered and the wire 40 is deformed by the second electrode side tip 62 (step SP05). In addition, after moving the capillary 60 in the X2 direction relative to the first electrode 10 (step SP07), the capillary 60 is lowered and the wire 40 is deformed by the first electrode side tip 61 (step SP08). Then, the wire 40 is connected to the second electrode 20 (step SP14). The distance of the above movement of the capillary 60 in the X1 direction and the distance of the above movement of the capillary 60 in the X2 direction are within the range of the ball part 30. In this way, in the manufacture of the semiconductor device 110, crushing the wire 40 a first time (step SP05) and crushing the wire 40 a second time (step SP08) are carried out.

The wire 40 can be made thinner as a result of crushing the first time, so the height of the wire 40 can be lowered. Also, as a result of crushing the wire 40 the second time, it is possible to draw out the wire 40 generally parallel to the major surface of the semiconductor element 5, so the height of the wire 40 can be lowered.

On the other hand, as illustrated in FIG. 8B, in the manufacture of the semiconductor device 119 according to the reference example, after lowering the capillary 60 and forming the ball part 30 (step SP02), the capillary 60 is raised (step SP03), and after moving the capillary 60 in the X1 direction relative to the first electrode 10 (step SP119a), the capillary 60 is raised further (step SP119b), then the capillary 60 is moved in the X2 direction and the capillary 60 returns over the ball part 30 again (step SP119c). Then the capillary 60 is lowered and the wire 40 is deformed by the capillary 60 (step SP08). In other words, in the manufacture of the semiconductor device 119 of the reference example, step SP05 (crushing the wire 40 the first time) is not carried out.

In the semiconductor device 119, by carrying out the operation of step SP119 in which after moving the capillary 60 in the X1 direction, the capillary 60 is raised further and it returns to the original position, the wire 40 is folded in two, and in step SP08 the wire 40 is connected to the ball part 30. Then, the wire 40 is extended from this connection toward the second electrode 20. In this way, the height of the loop shape of the wire 40 is reduced. However, as described above, in the semiconductor device 119, by folding the wire 40 in two, the double turned-back portion 49 becomes thicker, and the quantity of wire used is large.

If step SP05 to deform the first time is not carried out, and in step SP119, in which the capillary 60 is raised further, the distance of the capillary 60 along the X-axis direction or the Z-axis direction is changed, it would become difficult to fold the wire 40 in two, for example. Therefore, in the processes after step SP08, the wire 40 has a shape that stands generally vertical from the ball part 30, for example, and as a result the wire 40 has a loop shape, and the height of the wire 40 is high.

In contrast, in the manufacture method of the semiconductor device 110 according to the embodiment, by crushing the wire 40 the first time (step SP05) and crushing the wire 40 the second time (step SP08), the shape of the wire 40 on the upper part of the ball part 30 becomes slanted with respect to the ball part 30, and as a result, the extending direction of the wire 40 becomes substantially parallel to the X-axis direction, and the height of the loop shape of the wire 40 can be reduced. Also, the turned-back portion 41 is thin and small, so the quantity of wire is small.

As described above, in the reference example in which step SP05 is not carried out, and its variations, it was difficult to achieve both a reduction in the height of the wire 40 and a reduction of quantity of wire, but by the configuration according to the embodiment, both reduction in the height of the loop shape of the wire 40 and reduction in the quantity of wire can be achieved.

Also, by providing the turned-back portion 41, the contact area between the wire 40 and the ball part 30 is increased. In other words, it can be said that the adhesion strength between the wire 40 and the ball part 30 is increased. As a result, in the processes of step SP11 to step SP14, the possibility for separation of the wire 40 and the ball part 30 can be reduced. Also, as a result of crushing the first time and the second time, the wire 40 contacts the ball part 30 near the center in the X-axis direction, so it is possible to further increase the adhesion strength between the wire 40 and ball part 30.

A semiconductor device of an example according to the first embodiment will be described.

Figure 9A:
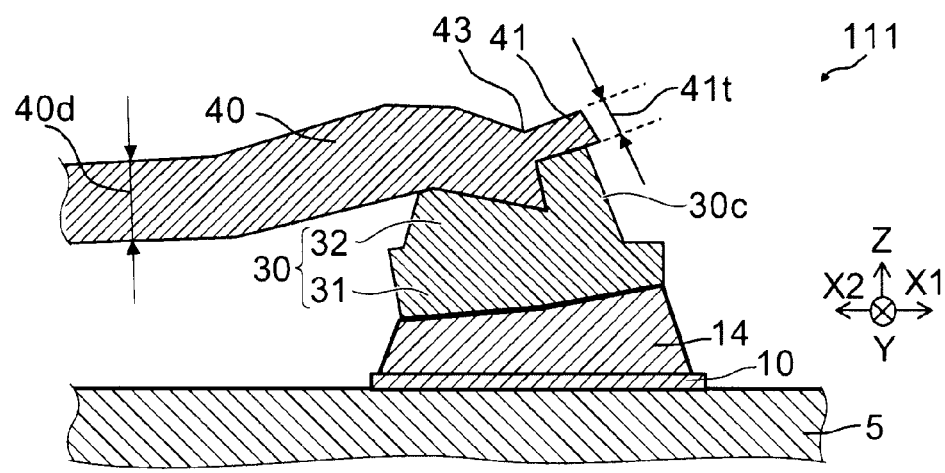
FIGS. 9A and 9B are schematic views illustrating the configuration of a semiconductor device according to an example.
Figure 9B:
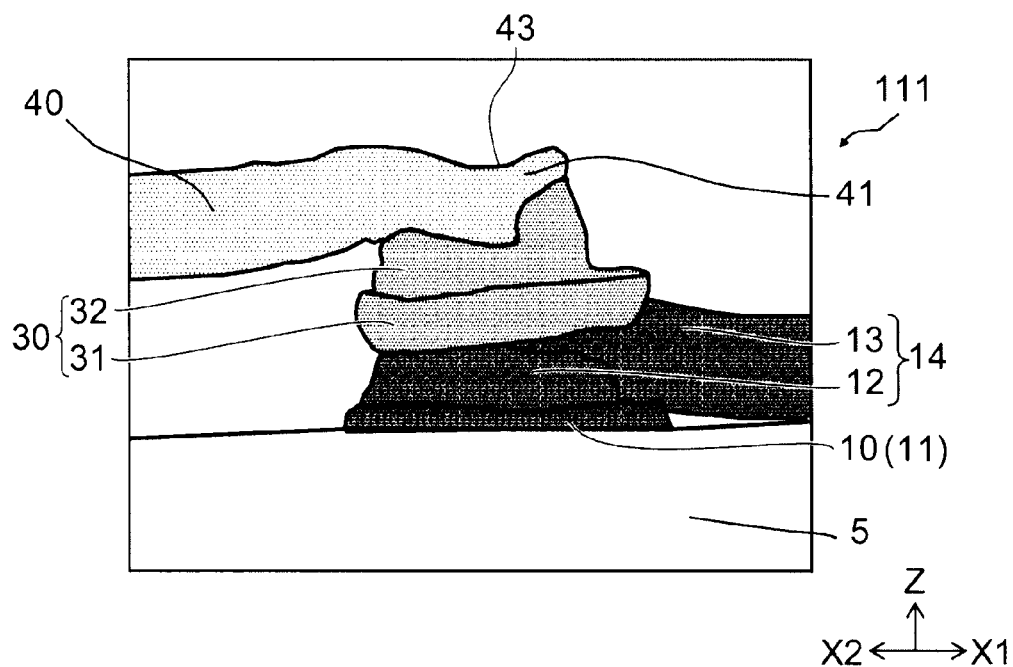

FIGS. 9A and 9B are schematic views illustrating the configuration of the semiconductor device according to the example.

Specifically, FIG. 9A is a schematic cross-sectional view, and FIG. 9B is a schematic view. For ease of understanding, FIG. 9B is based on a scanning electron microscope (SEM) photograph of a semiconductor device 111 according to the example, to which the outline shape of each element has been drawn.

As illustrated in FIGS. 9A and 9B, in the semiconductor device 111 of the example according to this embodiment, a pad electrode 11 provided on the semiconductor element 5 is used as the first electrode 10 that is electrically connected to the semiconductor element 5. Also, a lower layer connection part 14 is provided between the pad electrode 11 and the ball part 30. The lower layer connection part 14 includes a lower layer wire 13 that is connected to the pad electrode 11 and a lower layer terminal part 12 of the lower layer wire 13. The lower layer wire 13 connects the pad electrode 11 and another electrode (not illustrated) provided farther to the X1 direction than the pad electrode 11.

The ball part 30 is provided on the lower layer connection part 14. In other words, in the semiconductor device 111, the lower layer connection part 14 that includes the lower layer terminal part 12 and the lower layer wire 13 is provided between the first electrode 10 (pad electrode 11) and the ball part 30. In this way, in the embodiment, any conductive member can be inserted between the first electrode 10 and the ball part 30. Also, the ball part 30 and the wire 40 connected to the ball part 30 are provided on the lower layer connection part 14 as a second connection part (upper layer connection part). In this way, the connection parts can be stacked.

Also in the semiconductor device 111, the thickness 41t of the turned-back portion 41 of the wire 40 is smaller than the diameter 40d of the wire 40. Also in the semiconductor device 111, the length of the turned-back portion 41 is short, and the end 41e of the turned-back portion 41 is closer to the second electrode 20 than the end 30e of the ball part 30. Also in the semiconductor device 111, the turned-back portion 41 does not protrude from the ball part 30. In this way, it is possible to provide a semiconductor device with a reduced quantity of wire.

Figure 10:
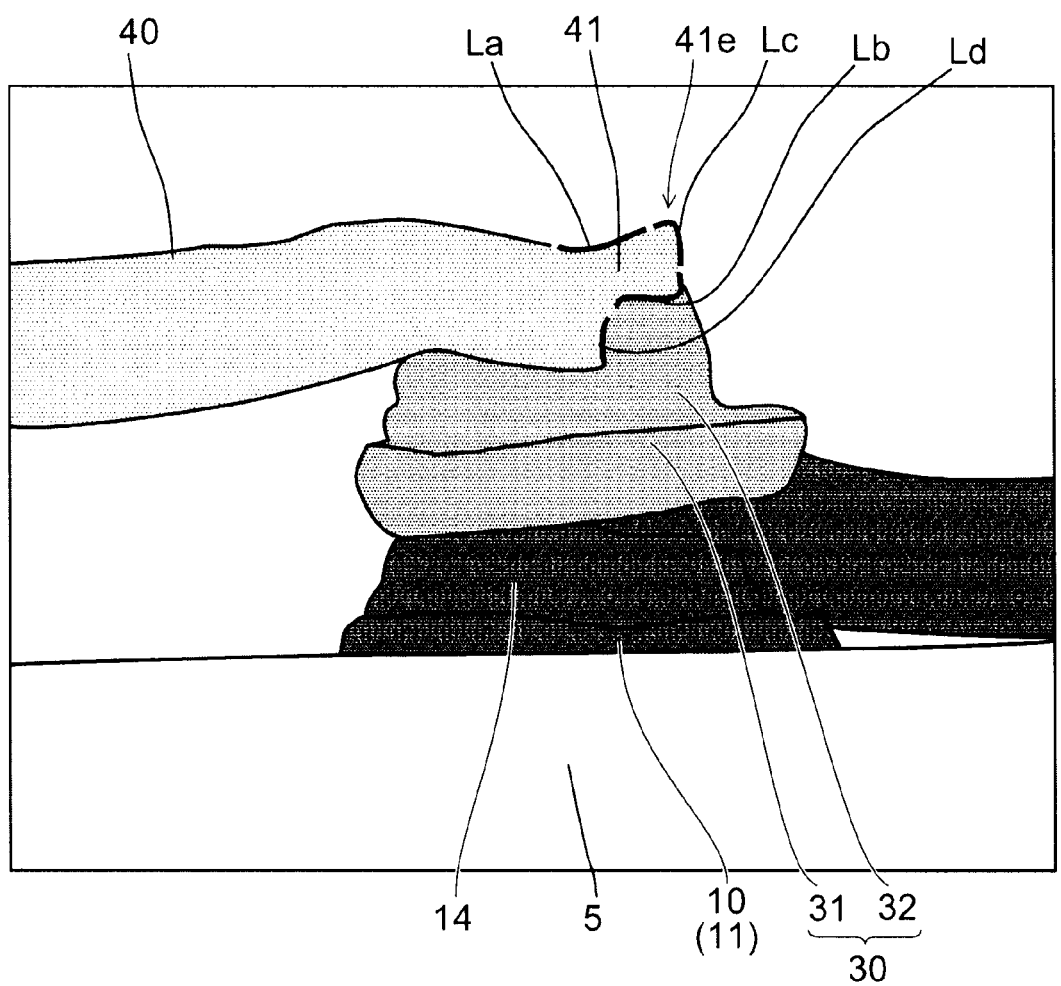
FIG. 10 is a schematic view illustrating the configuration of the semiconductor device according to the example.

FIG. 10 is a schematic view illustrating the configuration of the semiconductor device according to the example.

FIG. 10 is an enlargement of FIG. 9B.

As illustrated in FIG. 10, in the semiconductor device 111, the turned-back portion 41 includes lines (line La, line Lb, line Lc) that correspond to the step in the turned-back portion 41.

The line La corresponds to the top surface of the turned-back portion 41. The line Lb corresponds to the boundary of the bottom side of the turned-back portion 41 and the top surface of the protrusion 30c. The line Lc corresponds to the end 41e of the turned-back portion 41 on the side opposite to the second electrode (the X1 direction side).

In addition, the boundary line Ld corresponds to the boundary between the side face of the protrusion 30c of the ball part 30 and the wire 40.

These lines La, Lb, Lc, and Ld are formed by carrying out the steps Sp05, SP06, SP07, and SP08 described above.

In the following, the state of the wire 40 in steps SP05 to SP08 will be explained in detail.

FIGS. 11A to 11D are schematic views illustrating a method for manufacturing the semiconductor device according to the example.

Specifically, FIGS. 11A, 11B, 11C, and 11D schematically illustrate the state of the wire 40 in steps SP05, SP06, SP07, and SP08.

Figure 11A:
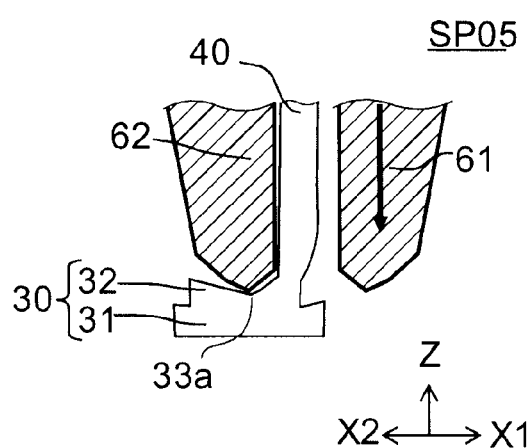
FIGS. 11A to 11D are schematic views illustrating a method for manufacturing the semiconductor device according to the example.

After bending the central axis of the wire 40 the first time in step SP04, as illustrated in FIG. 11A, the wire 40 is deformed by the second electrode side tip 62 in step SP05. In other words, the wire 40 is crushed. At this time, the ball part 30 is also deformed together. At this time, a recess shaped recess 33a is formed in the wire 40 and the ball part 30, based on the shape of the tip of the capillary 60. As illustrated in FIG. 11A, a capillary 60 with a tip that is sharper than the tip of the capillary 60 illustrated in FIG. 5D is used in this specific example.

Figure 11B:
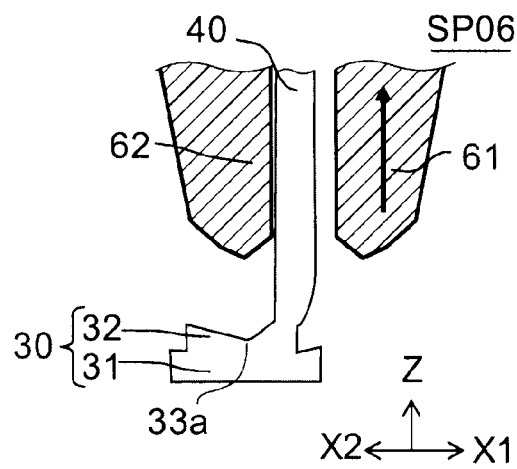
Figure 11C:
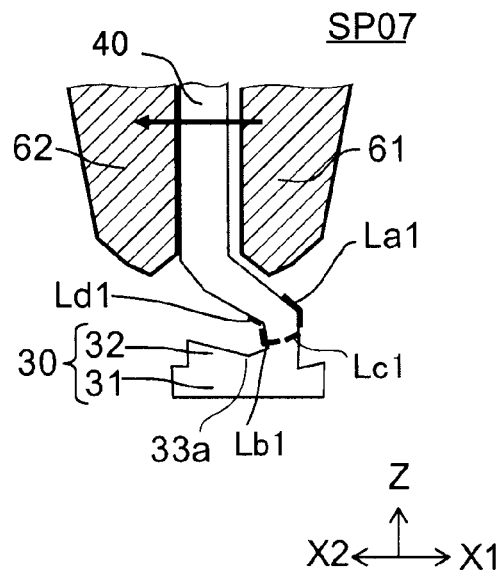

As illustrated in FIG. 11B, the capillary 60 is moved upward in step SP06. Then, as illustrated in FIG. 11C, the capillary 60 is moved in the X2 direction relative to the first electrode 60 in step SP07. In this way, the wire 40 is bend the second time.

At this time, as illustrated in FIG. 11C, a portion La1 that will become the line La is formed at the end in the X1 direction of the connection portion of the wire 40 and the ball part 30, a portion Ld1 that will become the line Ld is formed in the lower surface of the end in the X2 direction of the stand-up part of the wire 40, and a portion Lb1 that will become the line Lb and a portion Lc1 that will become the line Lc are formed in the bottom portion of the connection portion of the wire 40 and the ball part 30. Here, if the movement distance of the capillary 60 in the X2 direction is small, the portion that corresponds to the line La is crushed by the capillary 60, and the turned-back portion 41 of the wire 40 is not formed.

Figure 11D:
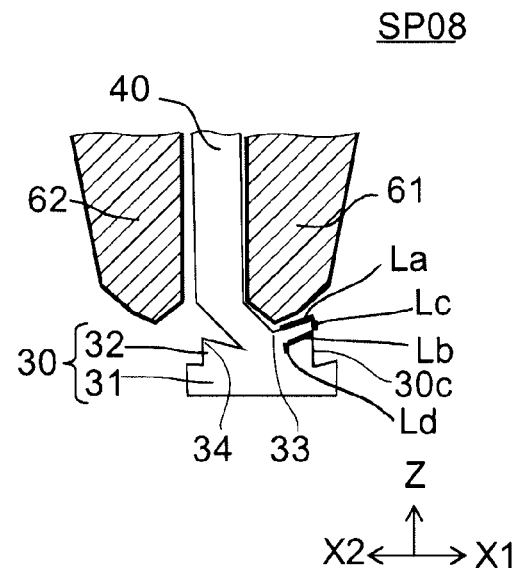

Then, as illustrated in FIG. 11D, in step SP08, the wire 40 is deformed by the first electrode side tip 61. The ball part 30 may also be deformed together, for example. The wire 40 is bend back, and a recess shaped recess is formed in the upper part of the wire 40 based on the shape of the tip of the capillary 60. In the example illustrated in FIG. 5D, in step SP08, a recess is not formed in the wire 40. In the example illustrated in FIG. 11D, a recess is formed in the wire 40 based on the sharp tip shape of the capillary 60.

As a result of step SP08, the wire 40 is overlapped on the recess 33a of the ball part 30 and the ball part 30 is pressed, and the recess 33 is formed in the ball part 30. As a result, in this specific example, the depth of the recess 33 formed in the ball part 30 is about half the thickness of the upper part 32 of the ball part 30. Here, if the depth of the recess 33 is made deeper, the height from the recess 33 to the peak 34 of the upper part 32 of the ball part 30 increases. As a result, it is possible to draw out the wire 40 generally parallel to the main plane of the semiconductor element 5, even if the wire 40 is long.

In this specific example, the line La is formed in the portion on the X1 side of the top surface of the wire 40, based on the portion La1. Also, the line Lc is formed in the end of the X1 direction of the connection portion of the wire 40 and the ball part 30, based on the portion Lc1. The line Lb is formed below the first electrode side tip 61 in the connection portion of the wire 40 and the ball part 30, based on the portion Lb1. Also, the line Ld is formed below the first electrode side tip 61 in the bent portion of the wire 40 that is in contact with the ball part 30, based on the portion Ld1.

The portion between the line La and the line Lb becomes the turned-back portion 41. By crushing the turned-back portion 41 with the capillary 60, the thickness 41t of the turned-back portion 41 becomes smaller than the diameter 40d of the wire 40.

In this way, in the semiconductor device 111 of the example, the recess 43 is formed in the wire 40 above the ball part 30, reflecting the shape of the tip of the capillary 60.

Second Embodiment

In a second embodiment, stacked semiconductor chips are used. The wire 40 makes electrical connection between the stacked semiconductor chips.

Figure 12A:
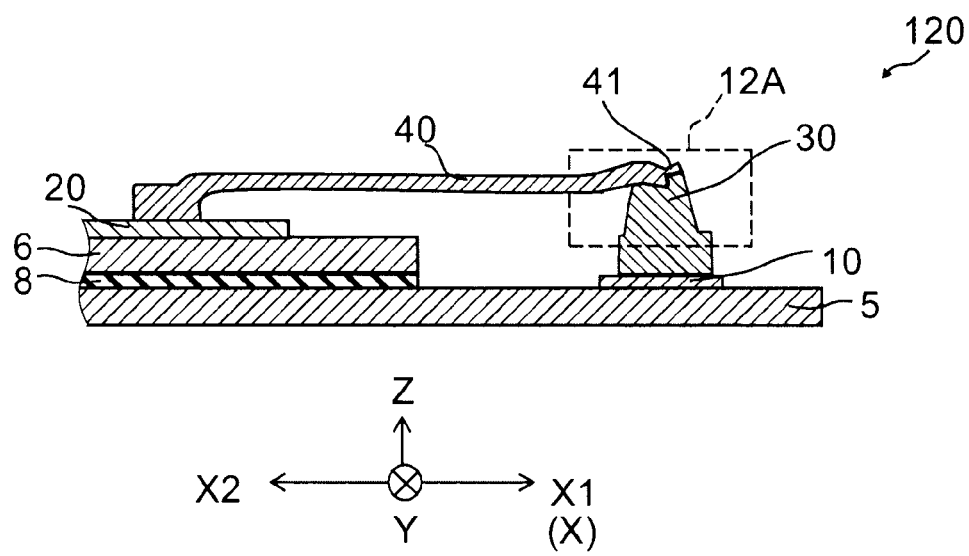
FIGS. 12A and 12B are schematic views illustrating the configurations of semiconductor devices according to a second embodiment.
Figure 12B:
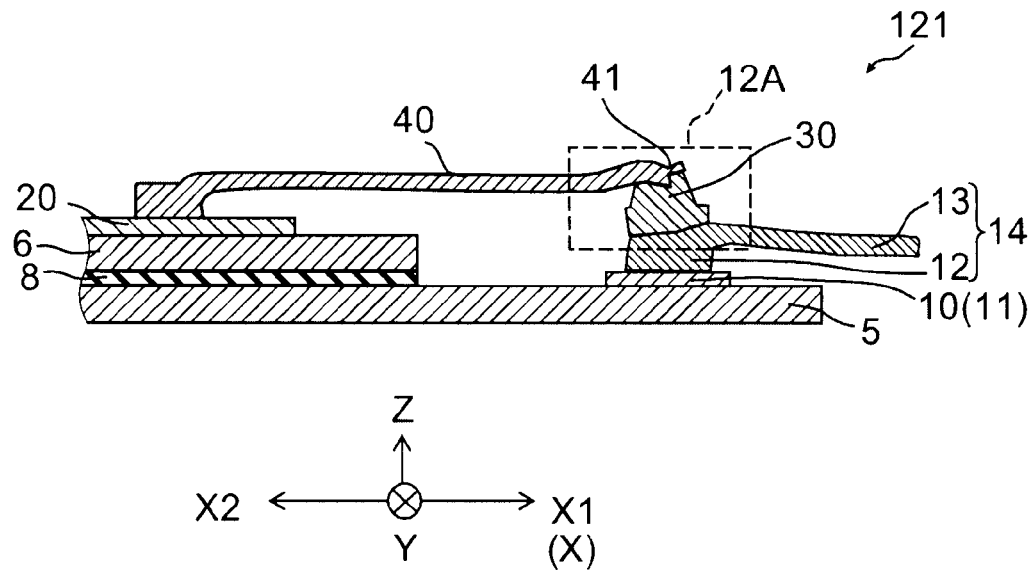

FIGS. 12A and 12B are schematic views illustrating the configurations of semiconductor devices according to the second embodiment.

As illustrated in FIG. 12A, a semiconductor device 120 according to this embodiment includes the first semiconductor element (semiconductor element 5) described above, the first electrode 10, the second electrode 20, the ball part 30, and the wire 40, and further includes a second semiconductor element 6 (semiconductor chip). A semiconductor chip, for example, such as memory, is used for the second semiconductor element 6. However, the embodiment is not limited thereto, and any semiconductor chip may be used for the second semiconductor element 6.

The second semiconductor element 6 is stacked on the major surface of the first semiconductor element (semiconductor element 5) on the side on which the first electrode 10 is provided. For example, an insulating resin layer 8 or the like is provided between the first semiconductor element (semiconductor element 5) and the second semiconductor element 6.

The second electrode 20 is electrically connected to the second semiconductor element 6.

The wire 40 is substantially parallel to the major surface of the first semiconductor element (semiconductor element 5) and the major surface of the second semiconductor element 6 between above the first electrode 10 and above the second electrode 20.

The configuration of the vicinity of the connection portion between the wire 40 and the ball part 30 illustrated in FIGS. 12A and 12B is the same as that of the semiconductor device 110, so its description is omitted.

In the semiconductor device 120 according to this embodiment, the thickness 41t of the turned-back portion 41 of the wire 40 is smaller than the diameter 40d of the wire 40, and at the same time the extending direction of the wire 40 can be substantially parallel to the major surface of the first electrode 10. Also in the configuration in which the semiconductor chips are stacked, the wire 40 can be extended substantially parallel to the major surface of the first electrode 10. In other words, the loop shape of the wire 40 can be made lower.

When the semiconductor chips are stacked, a step is produced in the Z-axis direction at the electrodes. In other words, the height along the Z-axis direction of the second electrode 20 provided on the major surface (top surface) of the second semiconductor element 6 is higher than the first electrode 10 provided on the major surface (top surface) of the first semiconductor element (semiconductor element 5).

At this time, in the semiconductor device 120, by adjusting the height of the ball part 30 so as to compensate for the difference in height of the second electrode 20 and the first electrode 10, for example, the height of the second electrode 20 and the height of the upper part of the ball part 30 are made substantially the same. In this way, it is possible to extend the wire 40 connecting the second electrode 20 and the ball part 30 substantially parallel with respect to the major surface of the first electrode 10. For example, if this type of wire 40 shape is used on the topmost layer semiconductor element of the semiconductor device 120, it is possible to effectively reduce the height of the semiconductor element 120.

As illustrated in FIG. 12B, also in another semiconductor device 121 according to this embodiment, the second semiconductor element 6 is provided.

In the semiconductor device 121, the pad electrode 11 provided on the first semiconductor element (semiconductor element 5) is used as the first electrode 10. Also, the lower layer connection part 14 that includes the lower layer terminal part 12 and the lower layer wire 13 is provided between the pad electrode 11 and the ball part 30. The lower layer wire 13 connects the pad electrode 11 and another electrode (not illustrated) provided farther to the X1 direction than the pad electrode 11.

The ball part 30 is provided on the lower layer connection part 14.

In other words, the semiconductor device 121 further includes the lower layer wire 13. One end of the lower layer wire 13 (lower layer terminal part 12) is connected between the ball part 30 and the first electrode 10. The lower layer wire 13 extends from the first electrode 10 toward the direction from the second electrode 20 toward the first electrode 10 (X1 direction).

In the semiconductor device 121, the difference in height of the first electrode 10 (pad electrode 11) and the second electrode 20 is compensated for by the height of the lower layer terminal part 12 and the lower layer wire 13. In this way, it is possible to extend the wire 40 connecting the second electrode 20 and the ball part 30 substantially parallel with respect to the major surface of the first electrode 10 (pad electrode 11). For example, if this type of wire 40 shape is used on the topmost layer semiconductor element of the semiconductor device 121, it is possible to effectively reduce the height of the semiconductor element 121. Also, by disposing the lower layer wire 13 below the ball part 30, it is not necessary to increase the height of the ball part 30, so it is possible to reduce the materials used in the ball part 30.

A semiconductor device of an example according to this embodiment will be described.

FIGS. 13A to 13D are schematic views illustrating the configuration of the semiconductor device according to the example.

Figure 13A:
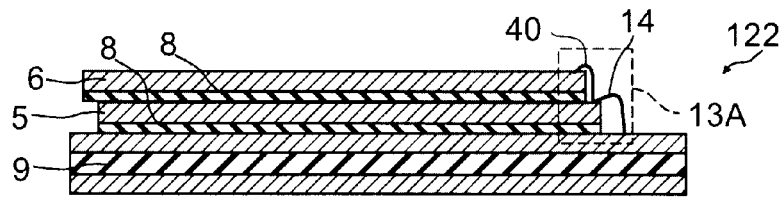
FIGS. 13A to 13D are schematic views illustrating the configuration of a semiconductor device according to the example.
Figure 13B:
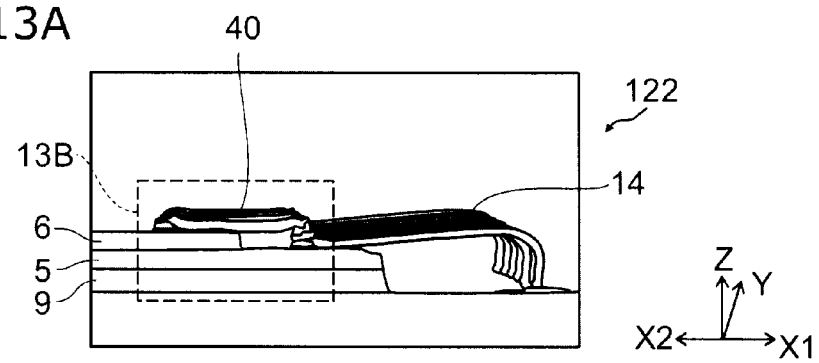
Figure 13C:
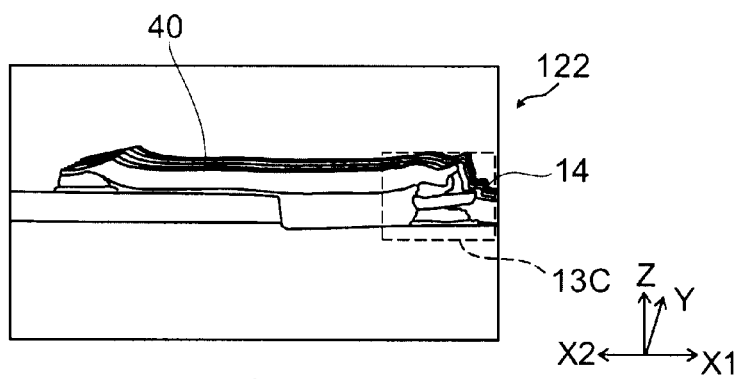
Figure 13D:
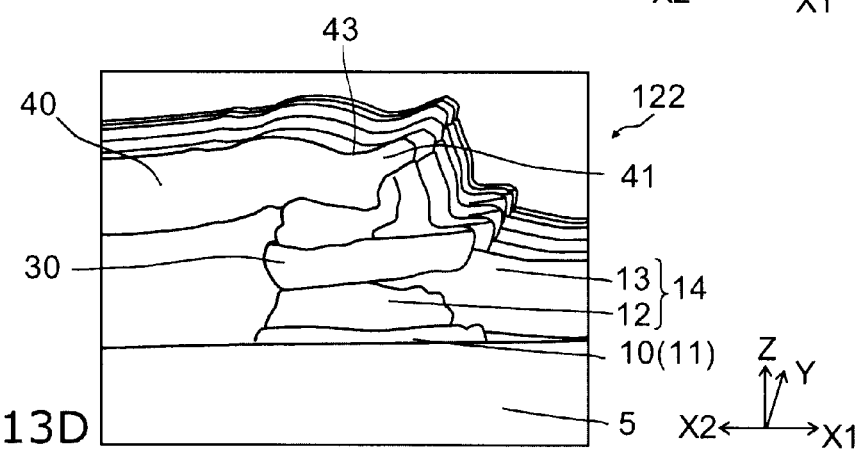

FIG. 13A is a schematic cross-sectional view illustrating the outline of the configuration of a semiconductor device 122 according to the example, FIG. 13B is a schematic perspective view of an enlargement of the part 13A in FIG. 13A, FIG. 13C is a schematic perspective view of an enlargement of the part 13B in FIG. 13B, and FIG. 13D is a schematic perspective view of an enlargement of the part 13C in FIG. 13C. FIGS. 13B, 13C, and 13D are based on SEM photographs of the semiconductor device 122, to which the outline shape of each element has been drawn.

As illustrated in FIG. 13A, in the semiconductor device 122, the first semiconductor element (semiconductor element 5) is provided on a substrate 9, and the second semiconductor element 6 is provided on the first semiconductor element. The first electrode 10 (not illustrated) of the first semiconductor element and the second electrode 20 (not illustrated) of the second semiconductor element 6 are connected by the wire 40, and an electrode that is not illustrated on the drawings provided on the substrate 9 and the first electrode 10 of the first semiconductor element are connected by a lower layer wire 13.

As illustrated in FIGS. 13B and 13C, a plurality of wires 40 is provided along the Y-axis direction, for example. FIG. 13D illustrates an enlargement of the wire 40 and the ball part 30 to which the wire 40 is connected.

As illustrated in FIG. 13D, in the semiconductor device 122, the thickness 41t of the turned-back portion 41 of the wire 40 is smaller than the diameter 40d of the wire 40.

As illustrated in FIG. 13C, also in the semiconductor device 122, the wire 40 is substantially parallel to the major surface of the first electrode 10 between above the first electrode 10 and above the second electrode 20.

Also, as illustrated in FIG. 13D, the portion of the lower layer wire 13 that extends from the portion connected to the first electrode 10 is substantially parallel to the major surface of the first electrode 10.

For example, if this type of wire 40 shape is used on the topmost layer semiconductor element of the semiconductor device 122, it is possible to effectively reduce the height of the semiconductor element 122. Also, by disposing the lower layer wire 13 below the ball part 30, it is not necessary to increase the height of the ball part 30, so it is possible to reduce the materials used in the ball part 30. Also, the turned-back portion 41 does not protrude from within the ball part 30 as viewed from the Z-axis direction, so it is possible to prevent short circuits between wires 40 that are adjacent in the Y-axis direction.

Figure 14A:
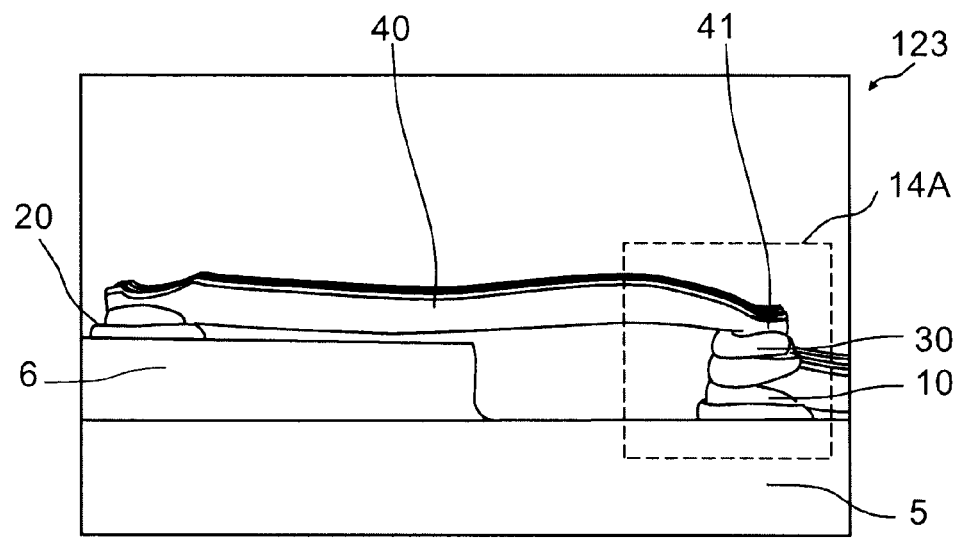
FIGS. 14A and 14B are schematic views illustrating the configuration of a semiconductor device according to another example.
Figure 14B:
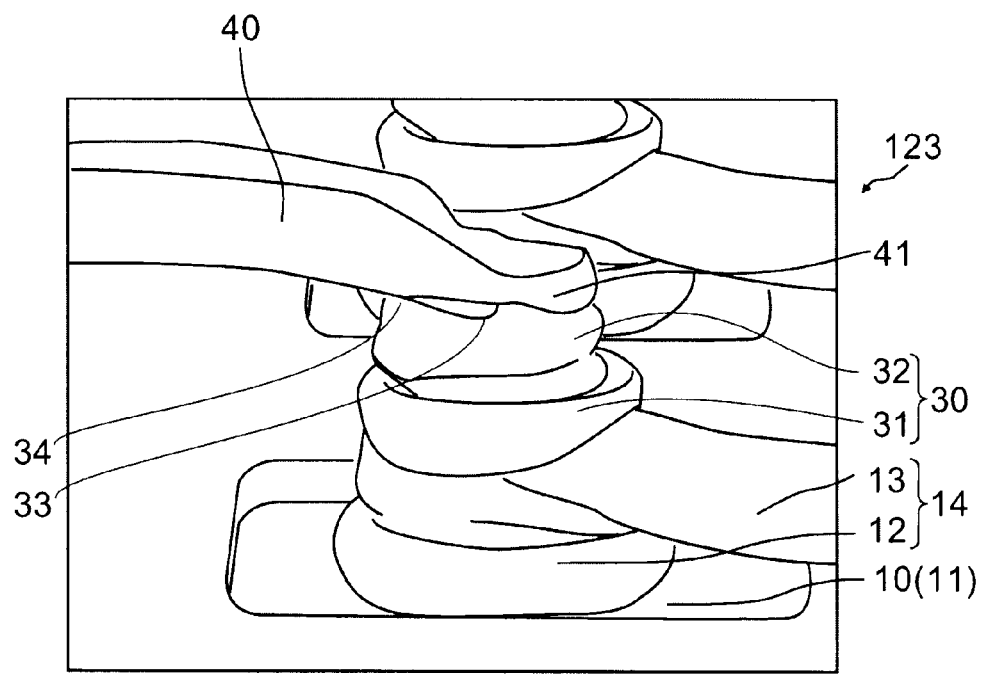

FIGS. 14A and 14B are schematic views illustrating the configuration of a semiconductor device according to another example.

FIG. 14A is a schematic perspective view of an enlargement of a part of a semiconductor device 123 of the other example according to this embodiment, and FIG. 14B is a schematic perspective view of an enlargement of the part 14A in FIG. 14A. FIGS. 14A and 14B are based on SEM photographs of the semiconductor device 123, to which the outline shape of each element has been drawn.

The semiconductor device 123 is manufactured by changing the manufacturing conditions, using the same capillary as the capillary 60 used in the manufacture of the semiconductor device 122. Specifically, in steps SP05, SP06, and SP07 in the manufacture of the semiconductor device 123, the movement distance of the capillary 60 is different from the movement distance for the semiconductor device 122. The movement distance in step SP05 for the semiconductor device 123 is shorter than that for the semiconductor device 122, the movement distance in step SP06 for the semiconductor device 123 is longer than that for the semiconductor device 122, and the movement distance in step SP07 for the semiconductor device 123 is shorter than that for the semiconductor device 122.

As illustrated in FIGS. 14A and 14B, in the semiconductor device 123, the thickness 41t of a turned-back portion 41 of the wire 40 is smaller than the diameter 40d of the wire 40. In this way, with changed manufacturing conditions for the movement distance of the capillary 60 in the manufacturing processes, it is possible to make the turned-back portion 41 of the wire 40 thinner.

As illustrated in FIG. 14B, in the semiconductor device 123, a recess is not provided in the wire 40 on the upper part of the ball part 30. In this way, even when the same capillary 60 is used, by changing conditions such as the movement distance of the capillary 60, manufacturing is possible in cases where the recess 43 is provided (semiconductor device 122 and the like) and cases where the recess 43 is not provided (semiconductor device 123).

As illustrated in FIG. 14A, in the semiconductor device 123 as well, the wire 40 is substantially parallel to the major surface of the first electrode 10 between above the first electrode 10 and above the second electrode 20. Also, no recess 43 is formed, so it is possible to raise the position of the bottom surface of the wire 40 without increasing the height of the ball part 30. As a result, it is possible to reduce the material of the ball part 30. Here, if the wire 40 is long, the wire 40 bends due to the self weight of the wire 40. However, the height of the ball part 30 can be increased, so even when the length of the wire 40 is increased, it is possible to reduce the possibility of the bottom surface of the wire contacting the semiconductor element 5 or the like due to the self weight of the wire 40. The recess 33 is formed in the upper part 32 of the ball part 30, and the peak 34 is formed in the upper part 32 of the end 30f on the second electrode 20 side of the ball part 30.

Figure 15:
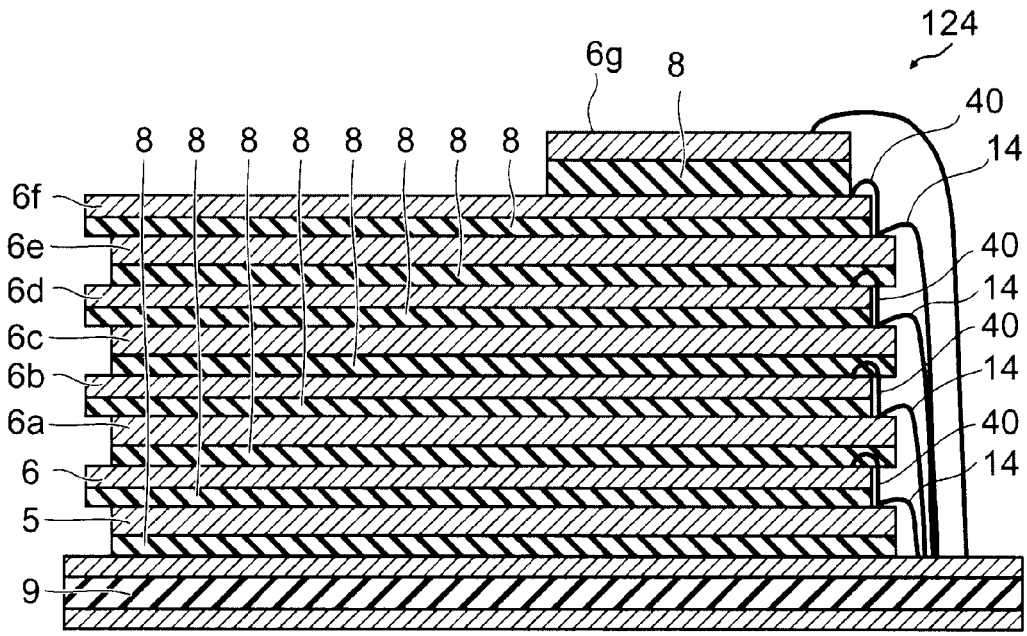
FIG. 15 is a schematic cross-sectional view illustrating the configuration of another semiconductor device according to the second embodiment.

FIG. 15 is a schematic cross-sectional view illustrating the configuration of another semiconductor device according to the second embodiment.

As illustrated in FIG. 15, the other semiconductor device 124 according to this embodiment includes the first semiconductor element (semiconductor element 5) provided on the substrate 9, the second semiconductor element 6 stacked thereon, and third to ninth semiconductor elements 6a to 6g sequentially stacked thereon. The semiconductor elements are connected to each other by wire 40.

An insulating resin layer 8 is provided between the semiconductor elements and between the substrate 9 and the first semiconductor element (semiconductor element 5).

In this specific example, the lower layer wire 13 connected to the substrate 9 is connected to a bottom of the ball part 30 corresponding to each wire 40.

In this way, in the semiconductor device, the number of semiconductor elements provided is arbitrary.

Also, for example, it is necessary to keep the height of the wire 40 between the second semiconductor element 6 and the third semiconductor element 6a low. This is because if the height of the wire 40 is high, the upper layer third semiconductor element 6a and the wire 40 may contact, and this could cause defective operation of the semiconductor device. Therefore, by using the wire 40 according to this embodiment, it is possible to carry out wire bonding even when there is a semiconductor element in the upper layer, and reduce the quantity of wire 40.

Third Embodiment

A third embodiment is a method for manufacturing a semiconductor device.

Figure 16:
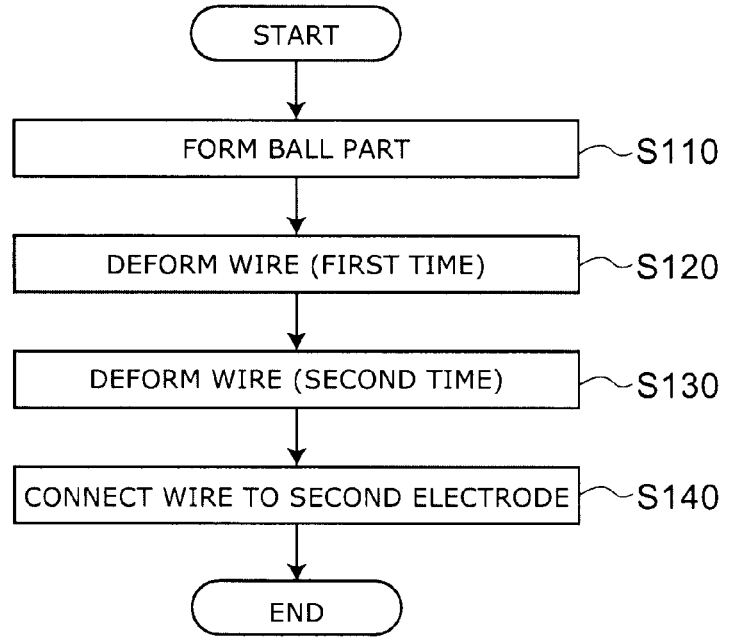
FIG. 16 is a flowchart illustrating a method for manufacturing a semiconductor device according to a third embodiment.

FIG. 16 is a flowchart illustrating a method for manufacturing a semiconductor device according to the third embodiment.

As illustrated in FIG. 16, the capillary 60 disposed above the first electrode 10 that is electrically connected to the semiconductor element 5 is lowered, the ball 30a at the tip of the wire 40 supported by the capillary 60 is pressed against the first electrode 10, and the ball part connected to the wire 40 is formed on the first electrode 10 (step S110).

In other words, steps SP01 and SP02 are executed.

After raising the capillary 60 and moving the capillary 60 toward the first direction (X1 direction), which is the direction from the second electrode 20 toward the first electrode 10, the wire 40 is pressed toward the first electrode 10 (pressed toward the first electrode 10) by the second electrode side tip 62 on the second electrode 20 side of the capillary 60, and by deforming the wire 40, a portion TN is formed having a diameter smaller than the diameter of the wire 40 (step S120). In other words, the wire is deformed (crushed) a first time.

In other words, steps SP03 to SP05 are executed. In step S120 (step SP05), the ball part 30 may also be deformed by pressing the ball part 30 against the first electrode 10.

After raising the capillary 60 and moving the capillary 60 toward the second direction (X2 direction), which is the direction from the first electrode 10 toward the second electrode 20, the wire 40 is pressed towards the first electrode 10 (pressed toward the first electrode 10) by the first electrode side tip 61 in opposition to the second electrode side tip 62 of the capillary 60, and the wire 40 is deformed (step S130). In this way, the wire is deformed (crushed) a second time. Then, the turned-back portion 41 having a thickness smaller than the diameter 40d of the wire 40 is formed on the end of the wire 40 opposite to the second electrode 20, based on the portion TN.

In other words, steps SP06 to SP08 are executed. In step S130 (step SP08), the ball part 30 may also be deformed by pressing the ball part 30 against the first electrode 10.

The end of the wire 40 on the side opposite to the ball part 30 is connected to the second electrode (step S140).

In other words, steps SP09 to SP14 are executed, for example.

In this way, it is possible to provide a semiconductor device manufacturing method capable of manufacturing a semiconductor device with the thickness 41t of the turned-back portion 41 of the wire 40 smaller than the diameter 40t of the wire 40, and capable of reducing the quantity of wire.

At this time, the range of movement of the capillary 60 along the X1 direction in step S120 is within the range above the ball part 30. Also, the range of movement of the capillary 60 along the X2 direction in step S130 is within the range above the ball part 30.

Fourth Embodiment

A fourth embodiment is a manufacturing apparatus for a semiconductor device.

As illustrated in FIG. 4A, the manufacturing apparatus according to this embodiment includes a capillary 60 that supplies a wire 40, and a control unit 80 that controls the position of the capillary 60.

The control unit 80 positions the capillary 60 above the first electrode 10 that is electrically connected to the semiconductor element 5 and lowers the capillary 60, presses the ball 30a at the tip of the wire 40 supported by the capillary 60 against the first electrode 10, and forms the ball part connected to the wire 40 on the first electrode 10 (step S110).

After raising the capillary 60 and moving the capillary 60 toward the first direction (X1 direction), which is the direction from the second electrode 20 toward the first electrode 10, the control unit 80 presses the wire 40 toward the first electrode 10 using the second electrode side tip 62 on the second electrode 20 side of the capillary 60, and by deforming the wire 40, forms a portion TN having a diameter smaller than the diameter of the wire 40 (step S120). The ball part 30 may also be deformed by pressing the ball part 30 against the first electrode 10.

After raising the capillary 60 and moving the capillary 60 toward the second direction (X2 direction), which is the direction from the second electrode 20 toward the first electrode 10, the control unit 80 presses the wire 40 toward the first electrode 10 using the first electrode side tip 61, which is in opposition to the second electrode side tip 62, of the capillary 60, and deforms the wire 40 (step S130). Then, the control unit 80 forms the turned-back portion 41 having a thickness smaller than the diameter 40d of the wire 40 on the end of the wire 40 opposite to the second electrode 20, based on the portion TN. The ball part 30 may also be deformed by pressing the ball part 30 against the first electrode 10.

Then, the control unit 80 connects the end of the wire 40 on the side opposite to the ball part 30 to the second electrode 20 (step S140).

According to this embodiment, it is possible to provide a manufacturing apparatus that manufactures semiconductor devices capable of reducing the quantity of wire.

According to the embodiment, it is possible to provide a semiconductor device, a method for manufacturing a semiconductor device, and a manufacturing apparatus for a semiconductor device capable of reducing the quantity of wire.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in semiconductor devices such as semiconductor elements, electrodes, ball parts, wires, and the like and manufacturing apparatuses for semiconductor devices such as capillaries, control units, and the like from known art. Such practice is included in the scope of the invention to the extent that similar effects thereto are obtained.

Any two or more components of the specific examples may be combined within the extent of technical feasibility and are included in the scope of the invention to the extent that the purport of the invention is included.

Moreover, all semiconductor devices, methods for manufacturing semiconductor devices, and manufacturing apparatuses for semiconductor devices practicable by an appropriate design modification by one skilled in the art based on the semiconductor devices, the methods for manufacturing semiconductor devices, and the manufacturing apparatuses for semiconductor devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a first semiconductor element;
   a first electrode electrically connected to the first semiconductor element;
   a ball part provided on the first electrode;
   a second electrode; and
   a wire connecting the ball part and the second electrode,
   wherein the wire including a turned-back portion at an end of the wire on a side opposite to the second electrode,
   a thickness of the turned-back portion being smaller than a diameter of the wire.

2. The device according to claim 1, wherein the end of the turned-back portion is closer to the second electrode than an end of the ball part on a side opposite to the second electrode.

3. The device according to claim 1, wherein the wire has a recess provided in a portion of the wire above the ball part, and
   a portion of the wire in close contact with the ball part extends upward.

4. The device according to claim 1, further comprising a second semiconductor element,
   the first semiconductor element having a major surface on a side where the first electrode is provided,
   the second semiconductor element being stacked on the major surface,
   the second electrode being electrically connected to the second semiconductor element, and
   the wire being substantially parallel to the major surface of the first semiconductor element and a major surface of the second semiconductor element between above the first electrode and above the second electrode.

5. The device according to claim 4, further comprising a lower layer wire,
   one end of the lower layer wire being connected between the ball part and the first electrode, and
   the lower layer wire extending from the first electrode toward a direction from the second electrode toward the first electrode.

6. The device according to claim 1, wherein
   the wire extends along an extension axis,
   the ball part has a seating part and an upper part provided on the seating part,
   a length of the seating part along the extension axis is longer than a length of the upper part along the extension axis, and
   the upper part includes a protrusion.

7. The device according to claim 6, wherein the protrusion is formed by crushing the upper part.

8. The device according to claim 6, wherein the turned-back part is located above the protrusion.

9. The device according to claim 6, wherein
   a diameter of the upper part is smaller than a diameter of the seating part, and
   a difference in the diameter of the upper part and the diameter of the seating part is not less than 5 micrometers and not more than 10 micrometers.

10. The device according to claim 6, wherein the diameter of the seating part is not less than 50 micrometers and not more than 60 micrometers.

11. The device according to claim 1, wherein the diameter of the wire is not less than 5 micrometers and not more than 40 micrometers.

12. The device according to claim 1, wherein the turned-back portion as viewed along a direction from the ball part toward the first electrode is located inside an outer edge of the ball part as viewed along the direction.

13. The device according to claim 1, wherein
    a plurality of the first electrodes are provided,
    each of a plurality of the ball parts is provided on each of the plurality of first electrodes, and
    a plurality of the wires are connected to each of the plurality of ball parts.

14. The device according to claim 1, wherein the ball part and the wire include gold.

15. The device according to claim 1, wherein the first semiconductor element is a semiconductor chip of a memory.

16. The device according to claim 1, further comprising a second semiconductor element, and
    the second electrode being connected to the second semiconductor element.

17. The device according to claim 1, wherein the second electrode is an electrode of a mounted component including at least one of a lead and a printed-circuit board.

18. The device according to claim 1, wherein
    the second electrode is juxtaposed with the first electrode, and
    a position along a direction from the ball part toward the first electrode of a surface where the first electrode is connected to the ball part is the same as a position along the direction of a surface where the second electrode is connected to the wire.

19. A method for manufacturing a semiconductor device, comprising:
    forming a ball part by lowering a capillary located above a first electrode electrically connected to a semiconductor element and pressing a ball at a tip of a wire supported by the capillary against the first electrode, the ball part being connected to the wire above the first electrode;
    forming a portion having a diameter smaller than a diameter of the wire by deforming the wire by pressing the wire toward the first electrode with a second electrode side tip of the capillary on a second electrode side after raising the capillary and moving the capillary toward a first direction from the second electrode toward the first electrode;
    forming a turned-back portion having a thickness smaller than the diameter of the wire at an end of the wire opposite to the second electrode and based on the portion by deforming the wire by pressing the wire toward the first electrode with a first electrode side tip in opposition to the second electrode side tip of the capillary after raising the capillary and moving the capillary toward a second direction from the first electrode toward the second electrode; and
    connecting an end of the wire on a side opposite to the ball part to the second electrode.

20. A manufacturing apparatus for a semiconductor device, comprising:
    a capillary configured to supply a wire; and
    a control unit configured to control a position of the capillary, the control unit
        forming a ball part by lowering the capillary after positioning the capillary above a first electrode electrically connected to a semiconductor element and pressing a ball at a tip of the wire supported by the capillary against the first electrode, the ball part being connected to the wire above the first electrode;
        forming a portion having a diameter smaller than a diameter of the wire by deforming the wire by pressing the wire toward the first electrode with a second electrode side tip of the capillary on a second electrode side after raising the capillary and moving the capillary toward a first direction from the second electrode toward the first electrode;
        forming a turned-back portion having a thickness smaller than the diameter of the wire at an end of the wire opposite to the second electrode and based on the portion by deforming the wire by pressing the wire toward the first electrode with a first electrode side tip in opposition to the second electrode side tip of the capillary after raising the capillary and moving the capillary toward a second direction from the first electrode toward the second electrode; and
        connecting an end of the wire on a side opposite to the ball part to the second electrode.

* * * * *